(12) United States Patent
Libsch et al.

(10) Patent No.: US 7,612,749 B2
(45) Date of Patent: Nov. 3, 2009

(54) DRIVING CIRCUITS FOR DISPLAYS

(75) Inventors: Frank Robert Libsch, White Plains, NY (US); James Lawrence Sanford, Hopewell Junction, NY (US)

(73) Assignees: Chi Mei Optoelectronics Corporation, Tainan (TW); Kyocera Corporation, Kyoto (JP)

( * ) Notice: Subject to any disclaimer, the term of this patent is extended or adjusted under 35 U.S.C. 154(b) by 130 days.

(21) Appl. No.: 10/379,481

(22) Filed: Mar. 4, 2003

(65) Prior Publication Data

US 2004/0174349 A1    Sep. 9, 2004

(51) Int. Cl.
*G09G 3/32* (2006.01)

(52) U.S. Cl. .......................... 345/82; 345/83

(58) Field of Classification Search ............ 345/76–83, 345/204–213; 315/169.3; *G09G 3/30, 3/32*
See application file for complete search history.

(56) References Cited

U.S. PATENT DOCUMENTS

| | | | |
|---|---|---|---|
| 5,903,246 A | 5/1999 | Dingwall | 345/44 |
| 5,952,789 A | 9/1999 | Stewart et al. | 315/169.4 |
| 6,023,259 A | 2/2000 | Howard et al. | |
| 6,157,356 A | 12/2000 | Troutman | |
| 6,229,506 B1 | 5/2001 | Dawson et al. | 345/82 |
| 6,479,940 B1 | 11/2002 | Ishizuka | |
| 6,518,962 B2 | 2/2003 | Kimura et al. | |
| 6,552,703 B1 | 4/2003 | Ushigusa | |
| 6,577,302 B2 * | 6/2003 | Hunter et al. | 345/204 |
| 6,583,775 B1 * | 6/2003 | Sekiya et al. | 345/76 |
| 6,680,580 B1 * | 1/2004 | Sung | 315/169.3 |
| 6,710,548 B2 | 3/2004 | Kimura | |
| 6,750,833 B2 * | 6/2004 | Kasai | 345/76 |
| 6,777,888 B2 * | 8/2004 | Kondo | 315/169.3 |
| 6,809,710 B2 | 10/2004 | Prache et al. | |
| 6,859,193 B1 | 2/2005 | Yumoto | |
| 6,861,810 B2 | 3/2005 | Rutherford | |
| 6,864,637 B2 | 3/2005 | Park et al. | |
| 6,885,356 B2 | 4/2005 | Hashimoto | |
| 6,917,350 B2 * | 7/2005 | Pae et al. | 345/55 |
| 6,919,868 B2 * | 7/2005 | Tam | 345/76 |

(Continued)

FOREIGN PATENT DOCUMENTS

WO    WO 99/38148    7/1999

OTHER PUBLICATIONS

G. Gu and Stephen R. Forrest, "Design of Flat-Panel Displays Based on Organic Light-Emitting Devices", IEEE Journal of Selected Topics in Quantum Electronics, vol. 4, No. 1, Jan./Feb. 1998.

(Continued)

*Primary Examiner*—Sumati Lefkowitz
*Assistant Examiner*—Ke Xiao
(74) *Attorney, Agent, or Firm*—Fish & Richardson P.C.

(57) ABSTRACT

A pixel circuit includes a light emitting device, a storage device configured to represent a level of illumination, and a driving device used to drive the light emitting device. Configuring the storage device includes changing a voltage difference across the storage device to a level larger than a threshold voltage of the driving device. The driving device reduces driving of the light emitting device while the storage device is being configured. After the storage device has been configured, the driving device is permitted to drive the light emitting device to emit light having a luminance level corresponding to the level of illumination represented by the storage device.

24 Claims, 21 Drawing Sheets

U.S. PATENT DOCUMENTS

2001/0043173 A1    11/2001    Troutman
2003/0095087 A1    5/2003    Libsch et al.
2004/0080474 A1*    4/2004    Kimura ..................... 345/82

OTHER PUBLICATIONS

Ton von de Biggelaar et al., "Passive and Active Matrix Addressed Polymer Light Emitting Diode Displays", vol. 4295, p. 134-146, Proc. SPIE, 2001.

T. Sasaoka et al. "24.4L: *Late-News Paper*: A 13.0-inch AM-OLED Display with Top Emitting Structure and Adaptive Current Mode Programmed Pixel Circuit (TAC)". SID 01 Digest, pp. 384-387, 2001.

M. Mizukami et al. "36.1: 6-Bit Digital CGA OLED". SID 00 Digest, pp. 912-915, 2000.

G. Rajeswaran et al. "40.1: *Invited Paper*: Active Matrix Low Temperature Poly-Si TFT/OLED Full Color Displays: Development Status". Development Status, SID 00 Digest, pp. 974-977, 2000.

Dawson et al., Abstract, "Design of an Improved Pixel for a Polysilicon Active-Matrix Organic LED Display", SID 98 Digest, p. 11-14, 1998.

Dawson et al., Abstract, "The Impact of the Transient Response of Organic Light Emitting Diodes on the Design of Active Matrix OLED Displays", IEDM 98, p. 875-878, 1998.

Kim et al., Abstract, "P-57: Three—Amorphous Silicon Thin-Film Transistors-based Active-Matrix Organic Polymer Light-Emitting Displays", Eurodisplay 2002, p. 601-604.

Hattori et al., "Current-Writing Active-Matrix Circuit for Organic Light-Emitting Diode Display Using a-Si:H Thin-Film-Transistors", IEICE Trans. Electron, E83-C(5):779-782, 2000.

He et al., "Current-Source a-Si:H Thin-Film Transistor Circuit for Active-Matrix Organic Light-Emitting Displays", IEEE Electron Device Letters, 21(12):590-592, 2000.

He et al., Abstract "Electrical Reliability of Two- and Four- a-Si:H TFT Pixel Electrode Circuits for Active-Matrix OLEDs", ISSN 2000, p. 354-357.

Wu et al., "A Novel Depletion-Gate Amorphous Silicon Thin-Film Transistor", IEEE 1992, p. 17-18.

\* cited by examiner $-V_{OLED}(max)-V_{TH7}(max)$ $V_{OLED}(max)-V_{OLED}(onset)+2*V_{TH7}(max)-V_{TH7}(min)$

DRIVING CIRCUITS FOR DISPLAYS

This description relates to pixel circuits for displays.

An active matrix organic light-emitting diode (OLED) display includes an array of pixel circuits that form rows and columns of pixels of the display. Each pixel circuit includes an OLED that is controlled by an active device such as a driving transistor. The OLED includes a light-emitting material that emits light when an electric current is passed through the material. The pixel circuit may include a storage capacitor that stores a voltage level representing a desired luminance of a pixel. The driving transistor supplies a current to the OLED according to the voltage level stored in the storage capacitor so that the OLED operates at a desired luminance level.

An active matrix OLED display typically does not have a backlight, so the driving transistors are turned on to drive the OLEDs when the pixels need to be illuminated. In one example, amorphous silicon thin film transistors are used as the driving transistors. Passing electric current through the amorphous silicon thin film transistors under the operating voltages of the transistors tends to stress the transistors, causing their threshold voltages to increase over the lifetime of the display. When the threshold voltages increase, the currents supplied by the transistors are reduced, thereby reducing the luminance of the OLEDs. Because different pixels have different luminance histories (some are turned on for longer periods of time that others), threshold voltage variations may cause non-uniformity in brightness across the display.

SUMMARY

In general, in one aspect, the invention features a method that includes configuring a storage device to represent a level of illumination, including changing a voltage difference across the storage device to a level larger than a threshold voltage of a driving device that is used to drive a light emitting device, while configuring the storage device, reducing the driving of the light emitting device by the driving device, and after the storage device has been configured, permitting the driving device to drive the light emitting device to emit light having a luminance level corresponding to the level of illumination represented by the storage device.

Implementations of the invention may include one or more of the following features. Reducing the driving of the light emitting device includes turning off the driving of the light emitting device. Reducing the driving of the light emitting device includes using a control device to reduce a current flowing through the driving device. The control device includes a transistor. Reducing the driving of the light emitting device includes isolating an input of the driving device from the storage device.

The driving device includes a transistor having a depletion gate and an accumulation gate, and reducing the driving of the light emitting device includes adjusting a voltage at the depletion gate. Configuring the storage device to represent a level of illumination includes storing a voltage level that is substantially equal to the sum of a data voltage representing the level of illumination and a threshold voltage of the driving device.

The method includes selectively reverse biasing the light emitting device. The method includes supplying a control voltage to the light emitting device such that a voltage difference develops across the storage device, the voltage difference being sufficient to turn on the driving device during the lifetime of the apparatus. The method includes setting a terminal of the light emitting device to at least two distinct voltage levels during different time periods to cause the threshold voltage of the driving device to develop across the storage device. The method includes supplying a control voltage to the light emitting device, the control voltage having a level so as to allow a current to conduct in the driving device but not allow the light emitting device to be turned on to emit light.

The driving device includes a drain electrode and a source electrode, the source electrode being coupled to a terminal of the light emitting device, and the method includes applying a control voltage to a terminal of the light emitting device, and setting the control voltage to a voltage level such that a voltage difference between the drain electrode and the control voltage is substantially equal to a sum of a first voltage and a second voltage, the first voltage being equal to a voltage across the light emitting device when the light emitting device is emitting light at a maximum luminance level, and the second voltage being equal to an approximate threshold value of the driving device. The method includes supplying a data voltage to the storage device using a data line, the data voltage representing a luminance level, the data line having a first ground voltage level that is different from a second ground voltage level of the driving device and the light emitting device.

In general, in another aspect, the invention features a method that includes using a driving device to drive a light emitting device that is directly connected to the driving device, configuring a storage device to represent a level of illumination, while configuring the storage device, reducing the driving of the light emitting device, and after the storage device has been configured, using the driving device to drive the light emitting device to emit light having a luminance level corresponding to the level represented by the storage device.

In general, in another aspect, the invention features a method that includes supplying a reference voltage through a switching device to a terminal of a storage device during a first time period, during the first time period, configuring the storage device to store a threshold voltage of a driving device used to drive a light emitting device, including applying a control voltage at a terminal of the light emitting device and modifying the control voltage relative to the reference voltage, and supplying a data voltage through the switching device to the terminal of the storage device during a second time period, the data voltage representing a luminance level.

Implementations of the invention may include one or more of the following features. The method includes allowing the driving device to drive the light emitting device according to the data voltage level. The first time period does not overlap the second time period. The switching device includes a transistor.

In general, in another aspect, the invention features a method of driving a pixel circuit that includes a driving device having a threshold voltage, a storage device, and a light emitting device having a first terminal configured to receive a current from the driving device and a second terminal coupled to a control voltage. The method includes setting the first terminal of the storage device to a first voltage level, setting the control voltage to a second voltage level that is more negative than the first voltage level, setting the control voltage to a third voltage level that is more positive than the second voltage level, and configuring the storage device to store a voltage level that is substantially the same as a sum of a data voltage and the threshold voltage, the data voltage representing a luminance level.

Implementations of the invention may include one or more of the following features. The method includes while configuring the storage device, reducing the driving of the light emitting device by the driving device. Reducing the driving of the light emitting device includes using a control device to reduce a current flowing through the driving device. Reducing the driving of the light emitting device includes using a switching device to decouple a control gate of the driving device from the storage device. The method includes compensating variations in the voltage level stored in the storage device due to a voltage coupling from the switching of the control voltage.

In general, in another aspect, the invention features a method that includes providing a first predefined voltage to a first terminal of a storage device during a first time period, providing a second predefined voltage to a second terminal of the storage device during a second time period, configuring the storage device during a third time period so that the first and second terminals have a voltage difference substantially the same as a present threshold voltage of a driving device, and configuring the storage device during a fourth time period so that the first and second terminals have a voltage difference that represents a level of illumination.

Implementations of the invention may include one or more of the following features. The method includes driving a light emitting device using the driving device according to the voltage difference representing the level of illumination. The difference between the first and second voltage is larger than the present threshold voltage of the driving device. The difference between the first and second voltage is substantially the same as an estimated threshold voltage of the driving device after the driving device has been in operation for a predetermine amount of time. The first, second, and third time periods are non-overlapping.

In general, in another aspect, the invention features a method that includes during a first time period, using a signal line to supply a first voltage to a first terminal of a storage device, during a second time period, using the signal line to supply a second voltage to a second terminal of the storage device such that a difference between the first and second voltage levels is greater than a threshold voltage of a transistor used to drive a light emitting device, during a third time period, configuring the storage device so that a voltage difference between the first and second terminals becomes substantially the same as a threshold voltage of the transistor, and during a fourth time period, supplying a data voltage to the first or second terminal, the data voltage representing a level of illumination.

Implementations of the invention may include one or more of the following features. The first, second, third, and fourth time periods are non-overlapping.

In general, in another aspect, the invention features a method that includes during a first time period, setting a first terminal of a charge storage device to a first predefined voltage, and setting a second terminal of the charge storage device to a second predefined voltage, and during a second time period, using a driving device to charge or discharge the charge storage device such that the charge storage device stores a voltage level substantially the same as a threshold voltage of the driving device used to drive a light emitting device.

Implementations of the invention may include one or more of the following features. The method includes driving the light emitting device using the driving device. The first time period does not overlap the second time period. The method includes supplying the first voltage to the first terminal through a first switching device and supplying the second voltage to the second terminal through a second switching device.

In general, in another aspect, the invention features a method that includes supplying a reference voltage to a first terminal of a capacitor, supplying a first control voltage to a cathode of a light emitting diode such that a voltage across the capacitor becomes larger than a threshold voltage of a transistor used to drive the light emitting diode, supplying a second control voltage to the cathode such that a voltage across the light emitting diode in the forward direction becomes less than an onset voltage of the light emitting diode, and charging or discharging the capacitor using the transistor such that a voltage substantially the same as a threshold voltage of the transistor develops across the capacitor.

Implementations of the invention may include one or more of the following features. The method includes charging or discharging the capacitor such that the capacitor stores a voltage level representing a level of illumination, and reducing the driving of the light emitting device by the transistor while the capacitor is being charged or discharged to represent the level of illumination. The method includes supplying the reference voltage to a signal line and connecting the signal line to the first terminal of the capacitor through a switching device during a first time period, and supplying a data voltage to the signal line and connecting the signal line to the first terminal of the capacitor through the switching device during a second time period, the data voltage representing a level of illumination.

In general, in another aspect, the invention features a method that includes using a transistor having a first control gate and a second control gate to supply a current to a light emitting device.

Implementations of the invention may include one or more of the following features. The method includes adjusting voltage levels at the first and second control gates to control the current supplied to the light emitting device. The method includes adjusting a voltage level at the first control gate to reduce a current flowing through the transistor while a storage device is configured to store a data voltage representing a level of illumination. The method includes adjusting a voltage level at the first control gate to reduce a current flowing through the transistor while a voltage representing a level of illumination is applied to the second control gate.

The method includes during a first time period, configuring a charge storage device to store a voltage level substantially the same as a threshold voltage of the transistor, and during a second time period, configuring the charge storage device to store a voltage level substantially the same as a sum of the threshold voltage and a data voltage, the data voltage representing a level of illumination. The method includes adjusting the voltage level of the first or second control gates to reduce the driving of the light emitting device during the second time period.

In general, in another aspect, the invention features an apparatus that includes a light emitting device, and a transistor to supply a current to the light emitting device, the transistor having at least two control gates.

Implementations of the invention may include one or more of the following features. The transistor includes a source electrode and a drain electrode, and one of the control gates is fabricated from a same layer of conducting material as the source electrode or the drain electrode. The transistor includes amorphous silicon, poly-silicon, or an organic semiconductor. The transistor includes a depletion gate and an accumulation gate. The light emitting device includes a light emitting diode. The light emitting device includes an organic light emitting diode. The driving device includes an N-type transistor. The apparatus includes a storage device configured to store a voltage level representing a level of illumination.

The storage device includes a capacitor. One control gate has a channel length that is less than one-third of a channel length of the other control gate.

In general, in another aspect, the invention features an apparatus that includes a storage device configured to store a voltage level representing a level of illumination, a light emitting device configured to receive a current at a first terminal and to receive a control voltage at a second terminal, the control voltage having a first voltage level and a second voltage level during two different time periods, and a driving device to supply the current to the light emitting device according to the voltage level stored in the storage device, the driving device configured to reduce the current supplied to the light emitting device during a period when the storage device is being configured to store the voltage level representing the level of illumination.

Implementations of the invention may include one or more of the following features. The driving device is configured to be turned off during a period when the storage device is being configured to store the voltage level. The apparatus includes a control device to reduce a current flowing through the driving device and the light emitting device during a period when the storage device is being configured to store the voltage level representing the level of illumination. The light emitting device includes a light emitting diode, the first voltage level causes the light emitting diode to be forward biased, and the second voltage level causes the light emitting diode to be reverse biased. The apparatus includes a switching device configured to reduce a current flowing from the driving device to the light emitting device during the period when the storage device is being configured to store the voltage level. The apparatus includes a switching device to decouple a control gate of the driving device from the storage device during the period when the storage device is being configured to store the voltage level.

In general, in another aspect, the invention features an apparatus that includes a storage device configured to store a voltage level representing a level of illumination, a light emitting device having a first terminal to receive a current and a second terminal to receive a control voltage, a control line to supply the control voltage, the control voltage having a first voltage level at a first time period and a second voltage level at a second time period, a signal line to supply a reference voltage to the storage device at a third time period and to supply a data voltage to the storage device at a fourth time period, and a driving device to drive the light emitting device to emit light at a level of illumination according to the voltage level stored in the storage device.

Implementations of the invention may include one or more of the following features. The first time period overlaps the third time period. The apparatus includes a switching device to reduce the driving of the light emitting device by the driving device while the signal line is supplying the data voltage to the storage device. The apparatus includes a switching device to decouple a control gate of the driving device from the storage device while the signal line is supplying the data voltage to the storage device.

In general, in another aspect, the invention features an apparatus that includes a light emitting device having a cathode connected to a first control signal that switches between different voltage levels, a storage device to store a voltage level, a driving device to drive the light emitting device according to the voltage level stored in the storage device, a switching device controlled by a second control signal that switches different voltage levels to connect or disconnect the storage device to a data line, the switching device, the driving device, and the different voltage levels of the first and second control signals are designed so that voltage variations imparted to the storage device due to switching of the first control signal are offset by voltage variations imparted to the storage device due to switching of the second control signal.

In general, in another aspect, the invention features a display that includes a plurality of pixel circuits, each pixel circuit including a light emitting device and a driving device to drive the light emitting device, the driving device having a first control gate and a second control gate to affect the driving of the light emitting device, and a display controller to supply control signals for controlling the pixel circuits.

In general, in another aspect, the invention features a display that includes a plurality of pixel circuits, each pixel circuit including a light emitting device, a storage device configured to store a voltage level representing a level of illumination, and a driving device to drive the light emitting device according to the voltage level stored in the storage device, the driving of the light emitting device by the driving device being reduced during a time period when the storage device is being configured to store the voltage level representing the level of illumination, and a display controller to supply control signals for controlling the pixel circuits.

In general, in another aspect, the invention features a television that includes a memory to store luminance data related to an image, pixel circuits, each pixel circuit including a light emitting device and a transistor to supply current to the light emitting device, the transistor having a first control gate and a second control gate, a controller to supply control signals for controlling the pixel circuits according to the data stored in the memory such that the light emitting devices emit light to display the image.

In general, in another aspect, the invention features a hand held device that includes a memory to store luminance data related to an image, pixel circuits, each pixel circuit including a light emitting device having a terminal, a storage device to store a voltage level, the storage device having a terminal and a driving device to drive the light emitting device according to the voltage level stored in the storage device, a controller to switch voltages of control lines coupled to the terminal of the light emitting device and the terminal of the storage device such that during a first time interval the storage device stores a voltage level substantially the same as a threshold voltage of the driving device, and during a second time interval the storage device stores a voltage level substantially the same as a sum of the threshold voltage and a data voltage representing a luminance level, the driving of the light emitting device being reduced during the second time interval.

In general, in another aspect, the invention features an apparatus that includes a pixel circuit having a light emitting device, a storage device to store a voltage level, and a driving device to drive the light emitting device according to the voltage level stored in the storage device. The apparatus includes control lines to supply control signals to the pixel circuit, the voltages on the control lines switching between different voltage levels. The apparatus includes a data line to supply a data voltage to the storage device, the data voltage representing a level of illumination. The apparatus includes a first node to supply a first ground voltage for the pixel circuit, and a second node to supply a second ground voltage for the data line, the second ground reference voltage being different from the first ground voltage by a predefined amount to compensate for variations in the voltage level stored in the storage device due to the switching of the control signals.

In general, in another aspect, the invention features a display that includes a light emitting device, a driving device for driving the light emitting device, and a storage device for storing a voltage level. The display includes means for controlling the light emitting device, the driving device, and the storage device such that the driving device drives the light emitting device to emit light at a user-defined luminance level independent of variations in a threshold voltage of the driving device. The display includes means for reducing light emitted by the light emitting device when a data voltage representing a level of illumination is supplied to the storage device.

In general, in another aspect, the invention features a display that includes a array of pixel circuits, each having a light emitting diode, a transistor, and a capacitor. The display includes means for switching voltage levels of the light emitting diodes and capacitors so that the light emitting diodes emit light at user-defined luminance levels independent of variations in threshold voltages of the transistors. The display includes means for compensating errors in the level of illumination of the light emitting diodes due to switching of the voltage levels of the light emitting diodes and the capacitors.

Other features and advantages of the invention will be apparent from the description and drawings, and from the claims.

DESCRIPTION

FIGS. 1, 3-7, 15, 17, and 20 show pixel circuits.

FIGS. 2, 9, 16, and 18 show timing diagrams.

Figure 1:
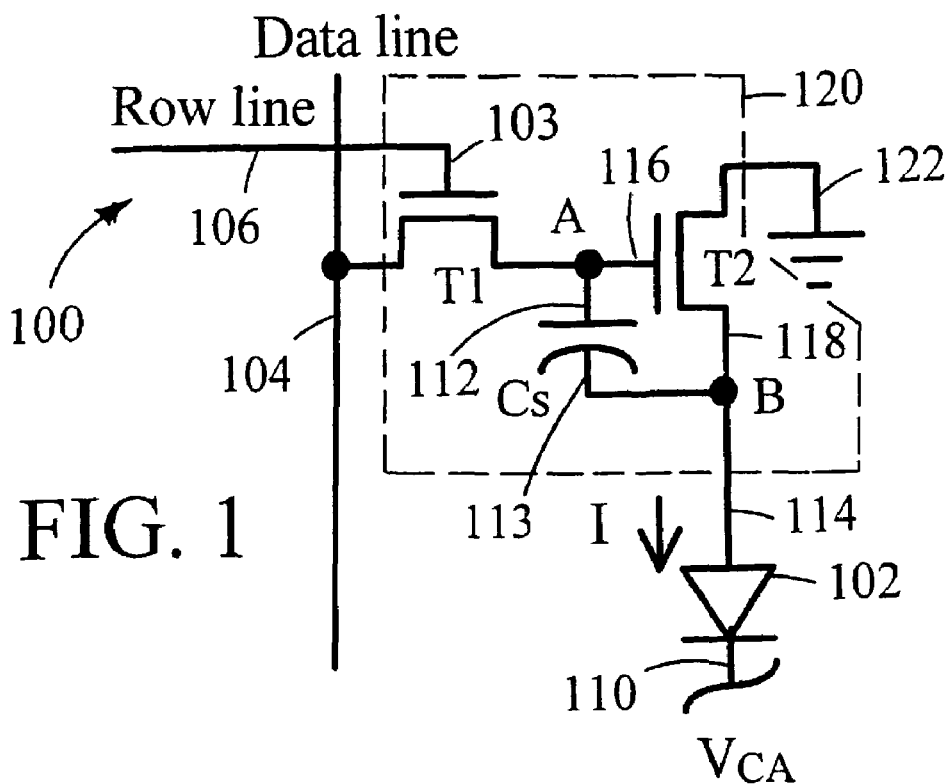
Figure 28:
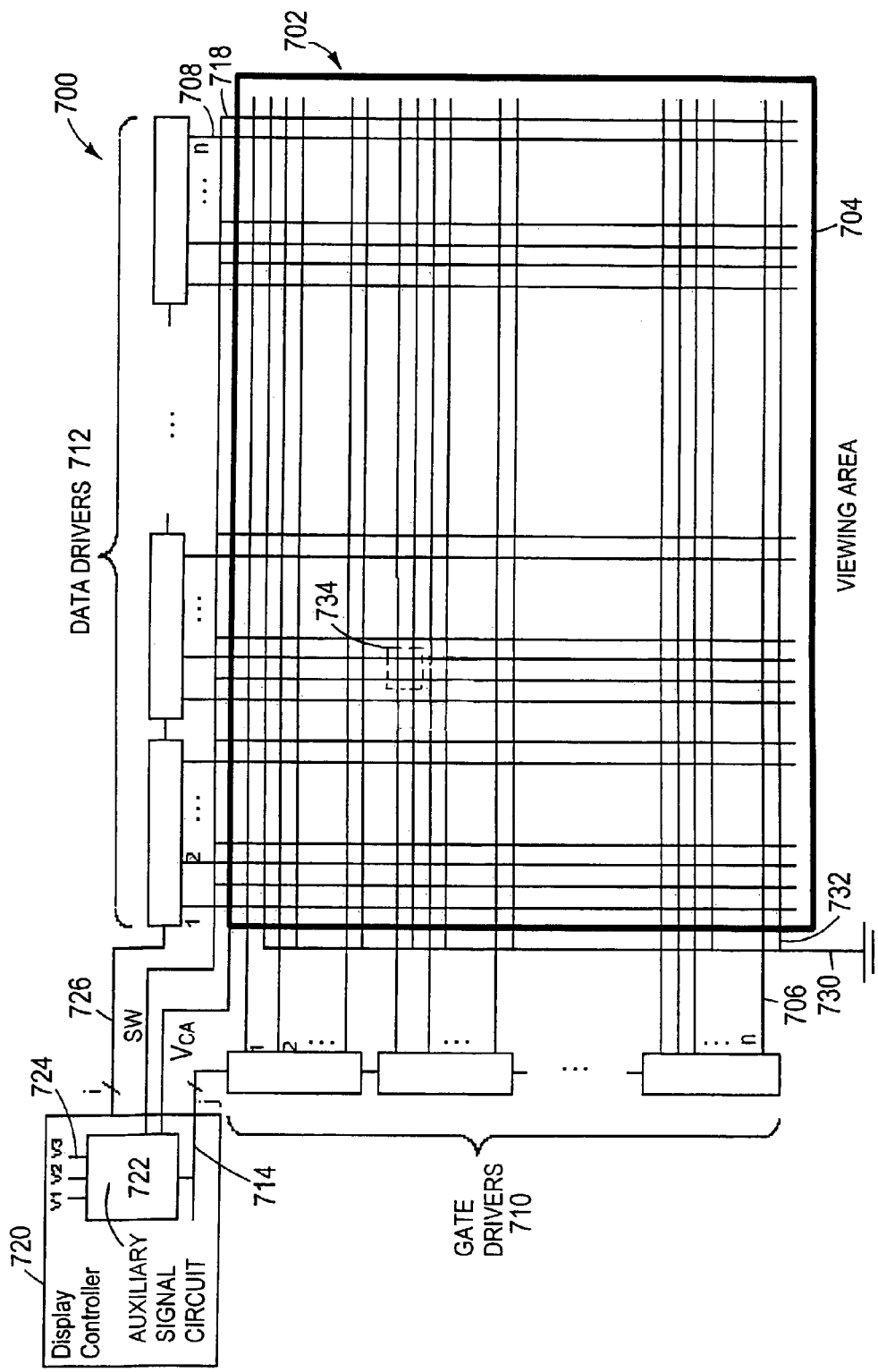
FIG. 28 shows a display having circuitry for driving pixel circuits.

Referring to FIG. 1, an active matrix OLED pixel circuit 100 includes an OLED 102 for emitting light that is seen by a user as a pixel of an active matrix OLED display 700 (FIG. 28). The luminance of the light emitted by OLED 102 is determined by a current I flowing through the OLED 102 and supplied by an NMOS driving transistor T2. The current I is determined by the amount of a gate-to-source voltage that is above a threshold voltage ($V_{TH2}$) of transistor T2. The threshold voltage of transistor T2 may change over time after repeated usage of the display. Pixel circuit 100 includes a storage capacitor $C_S$ that stores a voltage for controlling transistor T2, and an NMOS transistor T1 that connects the capacitor $C_S$ to a data line 104. Data line 104 supplies a data voltage ($V_{DATA}$) representing a user-defined pixel luminance level. Pixel circuit 100 operates with particular signal timings that are configured for compensating changes in the threshold voltage of transistor T2 so that OLED 102 emits light at the user-defined luminance level substantially independent of changes in the threshold voltage of T2.

Transistors T1 and T2, and capacitor $C_S$ form a data sampled current source 120 (enclosed in dashed lines) that supplies the current I to OLED 102 at a current level that is governed by the data voltage provided by data line 104 from a source, such as a display controller 720 (FIG. 28). The data voltage has a level that represents the user-defined pixel luminance. Capacitor C has a positive terminal 112 and negative terminal 113 that are connected to a gate 116 and a source 118 of transistor T2 at nodes "A" and "B", respectively. A voltage level substantially equal to ($V_{DATA}+V_{TH2}$) is established across capacitor $C_S$, even as the threshold voltage of transistor T2 changes over time. Let Vgs represent the gate-to-source voltage of transistor T2. Because the current I supplied by transistor T2 is (by nature of T2 when operating in the saturation region, i.e., Vds>Vgs−Vt) proportional to (Vgs−$V_{TH2}$)$^2$, the current I is proportional to $V_{DATA}^2$, and is independent of the threshold voltage of transistor T2. Thus, as the threshold voltage changes, the brightness of the illumination does not change.

Compensation of the variations of the threshold voltage can be performed by switching control voltages applied to pixel circuit 100 at different time intervals. In one time interval, the voltage of terminal 112 of capacitor $C_S$ and the voltage of a cathode 110 of OLED 102 are configured such that a voltage greater than the $V_{TH2}$ falls across the capacitor $C_S$. The voltage across the capacitor $C_S$ will be denoted $V_{CS}$. In a second time interval, the transistor T2 discharges the capacitor $C_S$ so that $V_{CS}$ becomes substantially the same as $V_{TH2}$. In a third time interval, a data voltage ($V_{DATA}$) is supplied to the capacitor $C_S$ to cause the capacitor to store a voltage level substantially the same as a sum of $V_{DATA}$ and $V_{TH2}$. During a fourth interval, the transistor T2 supplies OLED 102 with a driving current proportional to the data voltage.

Transistor T1 serves different functions during different time intervals. In one time interval, transistor T1 operates as a data reference voltage-switching transistor that connects terminal 112 of capacitor $C_S$ to a reference voltage provided on data line 104 during a time when a voltage level substantially equal to $V_{TH2}$ is established across the capacitor $C_S$. In the example illustrated in FIG. 1, the reference voltage is ground voltage 122. In another time interval, transistor T1 operates as a data voltage-sampling transistor that connects terminal 112 to a data voltage ($V_{DATA}$) provided on data line 104 so that the data voltage can be written into the capacitor $C_S$ (that is, $V_{CS}$ becomes $V_{TH2}+V_{DATA}$).

Capacitor $C_S$ is designed to be large (e.g., approximately 500 fF; 1 fF=$10^{-12}$ Farad) compared to parasitic capacitances (e.g., approximately 50 fF) of transistors T1 and T2, but small compared to the capacitance (e.g., approximately 6 pF) of OLED 102.

OLED 102 illuminates when a voltage measured from an anode 114 to cathode 110 is above an onset voltage ($V_{ONSET}$). Cathode 110 is fabricated to be connected to all pixels in display 700 to provide a common current return. When an active matrix OLED display is fabricated, OLED layers (that form, e.g., OLED 102) are deposited over an array of data sampled current source 120 circuits, each having an anode contact. Cathode 112 is formed by depositing a conducting metal, often transparent, such as indium tin oxide (ITO), over the OLED layers. The common cathode 110 is connected to a driving circuit (e.g., controller 720) outside of the array of pixel circuits.

Figure 2:
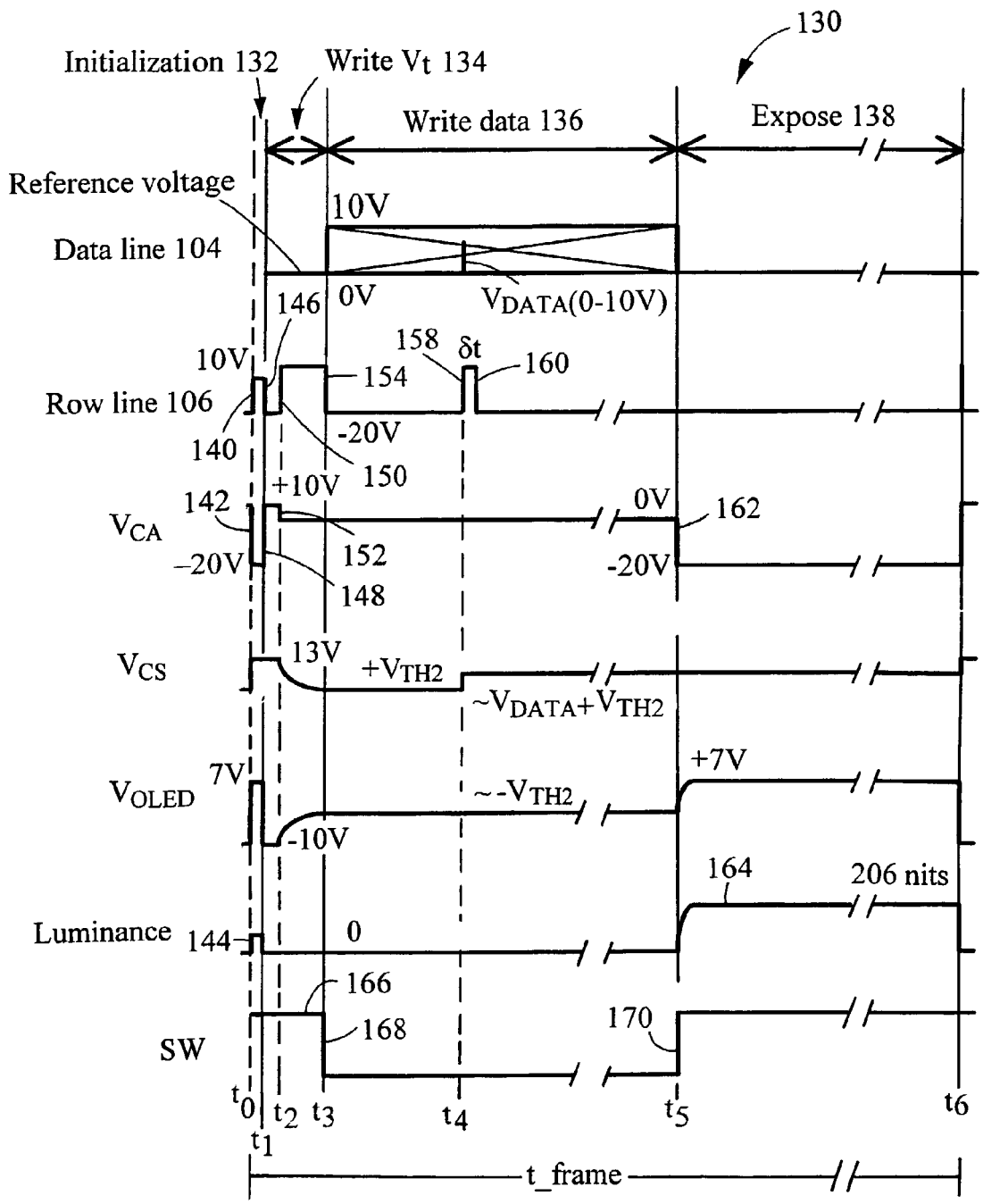

Referring to FIG. 2, timing diagram 130 shows signal timings for pixel circuit 100 during a frame period t_frame in which an entire frame of image is refreshed on display 700. All pixel circuits are written with new data voltages during the frame period t_frame. Display 700 may show 60 frames of images per second, so the frame period may be about 16.7 milliseconds. In the example illustrated in FIG. 2, the frame period is divided into four subperiods: an initialization subperiod 132, a "write Vt" subperiod 134, a "write data" subperiod 136, and an expose subperiod 138. Initialization subperiod 132 spans a short interval (e.g., 10 µs; 1 µs=$10^{-6}$ second) from time t0 to time t1, the write Vt subperiod 134 spans from time t1 to time t3, the write data subperiod 136 spans from time t3 to time t5, and the expose subperiod 138 spans from time t5 to time t6.

Timing diagrams 130 show the signal timings for data line 104, row line 106, cathode ($V_{CA}$), capacitor ($V_{CS}$), OLED 102 ($V_{OLED}$), the luminance level of OLED 102, and an "SW" control signal. Data line 104 provides the reference voltage and data voltage that is written into capacitor $C_S$. Row line 106 controls the on/off status of transistor T1, thereby determining whether node A is connected to data line 104. $V_{CA}$ represents the voltage level of cathode 110 of OLED 102. $V_{OLED}$ represents the voltage across OLED 102, and is the voltage difference between anode 114 and cathode 110. The SW signal is not used for pixel circuit 100, but is used in other pixel circuits described later to turn off the driving transistor while a data voltage is written into the capacitor $C_S$.

The voltage levels for data line 104, row line 106, $V_{CA}$, and the SW signal are controlled by the display controller 720 in cooperation with data drivers 712 and gate drivers 710 (FIG. 28).

During the initialization subperiod 132, the voltages at terminals 112 and 113 of capacitor $C_S$ are set to an initial value so that the $V_{TH2}$ can subsequently be written into capacitor $C_S$. During the write Vt subperiod 134, a voltage level substantially equal to $V_{TH2}$ is established across capacitor $C_S$. During the write data subperiod 136, a data voltage ($V_{DATA}$) representing pixel luminance is written into capacitor $C_S$, that is, a voltage equal to $V_{DATA}+V_{TH2}$ is built up across the capacitor $C_S$. During the expose subperiod 138, transistor T2 is turned on to drive OLED 102 causing it to illuminate at the pixel luminance specified by the data voltage.

At time t0, one of the data drivers 712 (FIG. 28) supplies data line 104 with the reference voltage, which is 0V in the example illustrated. Row line 106 is pulled high (140) to a voltage of 20V to turn on transistor T1. Cathode 110 is pulled low (142) to a voltage of −20V. The voltage drop across capacitor $C_S$ and OLED 102 is 20 volts. As an example, 13V may fall across capacitor $C_S$, and 7V may develop across OLED 102, which turns on the OLED.

During the initialization subperiod 132, all OLEDs 102 in display 700 may emit light (144). In one example, the initialization subperiod 132 is repeated at the beginning of each successive frame period. The initialization subperiod 132 is kept short so that display 700 may achieve a high contrast. The average illumination over time is affected by the initialization illumination. In another example, the signal timings for the initialization subperiod 132 is applied at the beginning of the first frame period upon power up of display 700, but is not repeated in subsequent frame periods. In this case, the initialization subperiod 132 may be longer since any observed luminance would be perceived by the viewer to be part of the display's powering up process.

At time t1, row line 104 is brought low (146) to −20V. The voltage at cathode 110 is switched (148) to +10V. Due to the high capacitance of OLED 102 and capacitor $C_S$, voltages at node A and node B are increased by 30V, and become approximately +30V and +17V, respectively. Transistor T2 has a high gate voltage with respect to ground, which turns on transistor T2. A voltage of −10V is established across OLED 102, and a voltage of +13V is maintained across capacitor $C_S$.

At time t2, row line 106 is brought high (150) again to +20V while the voltage at cathode 110 is brought (152) to ground (0V). Transistor T2 charges up (or discharges) the capacitance of OLED 102 while discharging capacitor $C_S$ until the voltage at node B (connected to anode 114), is −$V_{TH2}$, resulting in $V_{CS}$ settling towards +$V_{TH2}$.

At time t3, row line 106 is brought low (154) to −20V, turning off transistor T1, causing node A to be at a virtual ground, meaning that node A is at ground voltage immediately after transistor T1 is turned off.

Sometime between t3 and t5, one of data drivers 712 provide data line 104 with a data voltage (156) having a voltage level that represents a desired pixel luminance. The data voltage has a level between 0 to 10V.

At time t4, row line 106 is brought high (158) with the voltage at cathode 110 still at 0V, turning on transistor T1, causing the data voltage to be written into capacitor $C_S$ through node A. Data line 104 charges the capacitor $C_S$ so that the voltage at node A increases towards $V_{DATA}$. After a short amount of time δt, row line 106 is pulled low (160), turning off transistor T1. As the capacitor $C_S$ is being charged, the OLED capacitance is also slightly charged. Time δt is selected so that the amount of voltage increase across capacitor $C_S$ at time t4+δt is substantially equal to $V_{DATA}$, for example, 97% of $V_{DATA}$.

At time t5, the voltage at cathode 110 is switched (162) to −20V. Transistor T2 operates in a current saturation mode because Vds>(Vgs−$V_{TH2}$), where Vds is the drain-to-source voltage of transistor T2. The current I flowing through transistor T2 and OLED 102 is, e.g., approximately:

$$I \propto (0.97 \times V_{DATA} + V_{TH2} - V_{TH2})^2 = (0.97 \times V_{DATA})^2. \quad (Eq.\ 1)$$

The current I causes OLED 102 to illuminate (164) at a luminance level of, e.g., 206 nits. Data sampled current source 120 implements a voltage data-to-current transfer function that is independent of $V_{TH2}$.

When transistor T2 is implemented using amorphous silicon, $V_{TH2}$ is initially about 2.5V. Over time, because the current flowing through transistor T2 causes electrical stress, the threshold voltage may increase to as high as 10V. By charging capacitor $C_S$ to a voltage level substantially equal to $V_{TH2}$ before charging the capacitor with the data voltage, data sampled current source 120 may provide a current I that causes OLED 102 to illuminate at a luminance level specified by $V_{DATA}$ on data line 104, substantially independent of $V_{TH2}$.

The signal timings in timing diagrams 130 are used for all pixel circuits 100 of display 700. During the write Vt subperiod 134, the threshold voltage of the driving transistors are written into corresponding capacitors of all pixel circuits 100. All pixel circuits 100 have corresponding luminance data written into the capacitors during the write data subperiod 136. The driving transistors of all pixel circuits 100 are turned on to drive all of the OLEDs at the specified luminance level during the expose subperiod 138.

Figure 3:
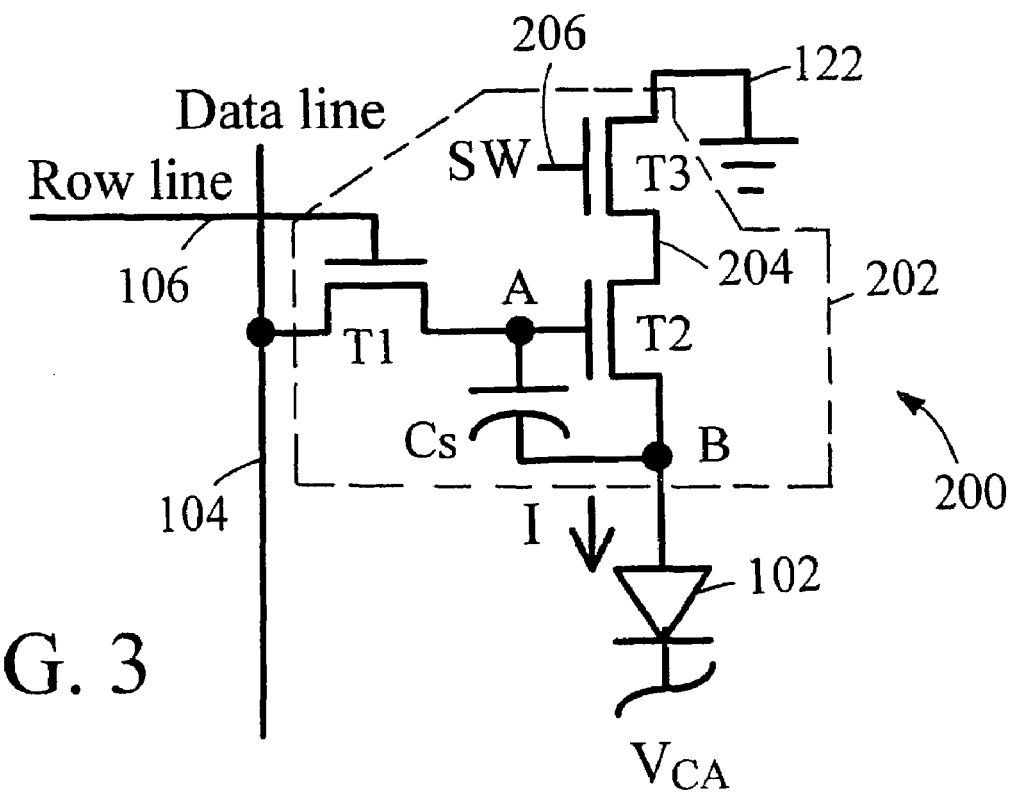

Referring to FIG. 3, another example of a pixel circuit 200 includes a data sampled switched current source 202 (enclosed in dashed lines) and an OLED 102. Data sampled switched current source 202 includes the circuit elements of data sampled current source 120 and an additional NMOS transistor T3 coupled between ground 122 and a drain 204 of transistor T2. An array of pixel circuits 200 is used to form an active matrix OLED display, such as display 700.

The signal timings in diagrams 130 can also be used for pixel circuit 170. Transistor T3 is controlled by an SW signal that is common to all pixel circuits in the array. During the initialization subperiod 132 and the write Vt subperiod 134, the SW signal is maintained at a logic high voltage level (166) to turn on transistor T3, allowing transistor T2 to operate in the same manner as it operates in pixel circuit 100. At time t3, the SW signal is pulled to a logic low voltage level (168) to turn off transistor T3 when luminance data ($V_{DATA}$) is written into capacitor $C_S$. Turning off transistor T3 stops current from flowing through transistor T2 when luminance data is written into capacitor $C_S$, thus minimizing changes in the voltage across OLED 102 while writing the luminance data. At time t5, the SW signal is pulled high (170) so that current may flow through transistor T2 and OLED 102 during the expose subperiod 138.

An advantage of pixel circuit 200 is that, because transistor T2 is turned off while the luminance data is written into capacitor $C_S$, the voltage level on data line 104 can be more accurately written into capacitor $C_S$, thus more accurately maintaining the $V_{TH2}$ voltage written into capacitor $C_S$. Without transistor T3, when luminance data is written into capacitor $C_S$, the voltage across capacitor $C_S$ will be greater than $V_{TH2}$, turning on transistor T2. This causes the voltage level at node B to change, causing errors both in the luminance data and the threshold voltage stored in capacitor $C_S$. Using transistor T3 to turn off transistor T2 while luminance data is written into capacitor $C_S$ ensures that the voltage across capacitor $C_S$ will be increased by an amount more closely to $V_{DATA}$ while maintaining the stored threshold voltage $V_{TH2}$.

Due to voltage coupling through stray capacitances (e.g., gate-to-source capacitance of transistor T3 and gate-to-drain capacitance of transistor T2), switching of the SW signal will affect $V_{CS}$. Due to voltage coupling through the gate-source capacitance of transistor T1, switching of the row line signal will affect $V_{CS}$. The control of the stored voltages on capacitor $C_S$ in pixel circuit 200 can be improved by adjusting the gate widths of transistors T1 and T2, and the logic high/low voltage levels of the SW signal so that the voltage coupling from the switching of the row line signal and the SW signal offset one another.

As an illustration, after $V_{DATA}$ is been written into capacitor $C_S$, row line 106 is pulled low (160). Transistor T1 has a gate-to-source capacitance Cgs1, which creates a negative voltage error on the capacitor $C_S$ as row line 106 is pulled low. The negative voltage error is about $$\frac{-(V_{ROW}(\text{high}) - V_{ROW}(\text{low})) \times Cgs1}{C_S}, \quad (\text{Eq. 2})$$

where $V_{ROW}(\text{high})$ is the logic high voltage level applied to row line 106 to turn on transistor T1, and $V_{ROW}(\text{low})$ is the logic low voltage level applied to row line 106 to turn off transistor T1. This negative voltage error can be compensated by adjusting the logic high/low voltage levels of the SW signal, and adjusting the change in voltage level of $V_{CA}$ at time t5.

At the beginning of the expose subperiod, the SW signal is set (170) to a logic high, which results in a positive voltage error on capacitor $C_S$. The voltage error is about $$\frac{(V_{SW}(\text{high}) - V_{SW}(\text{low})) \times Cgs3 \times Cgd2}{(Cgs3 + Cgd2) \times C_S}, \quad (\text{Eq. 3})$$

where $V_{SW}(\text{high})$ and $V_{SW}(\text{low})$ are the logic high and low voltage levels, respectively, that are applied to the SW signal, Cgs3 is the gate-to-source capacitance of transistor T3, and Cgd is the gate-to-drain capacitance of transistor T2. Because the gate-to-source and gate-to-drain capacitances are proportional to the width of the transistor, it is possible to cancel out the net error by setting $$(V_{ROW}(\text{high}) - V_{ROW}(\text{low})) \times Cgs1 = \quad (\text{Eq. 4})$$
$$\frac{(V_{SW}(\text{high}) - V_{SW}(\text{low})) \times Cgs3 \times Cgd2}{(Cgs3 + Cgd2)} +$$
$$(V_{CA}(\text{exposure}) - V_{CA}(\text{write data})) \times \left(Cgs1 + \frac{Cgs3 \times Cgd2}{Cgs3 + Cgd2}\right),$$

where $V_{CA}(\text{expose})$ and $V_{CA}(\text{write data})$ are the voltage levels for $V_{CA}$ during the expose and write data subperiods, respectively.

Figure 4:
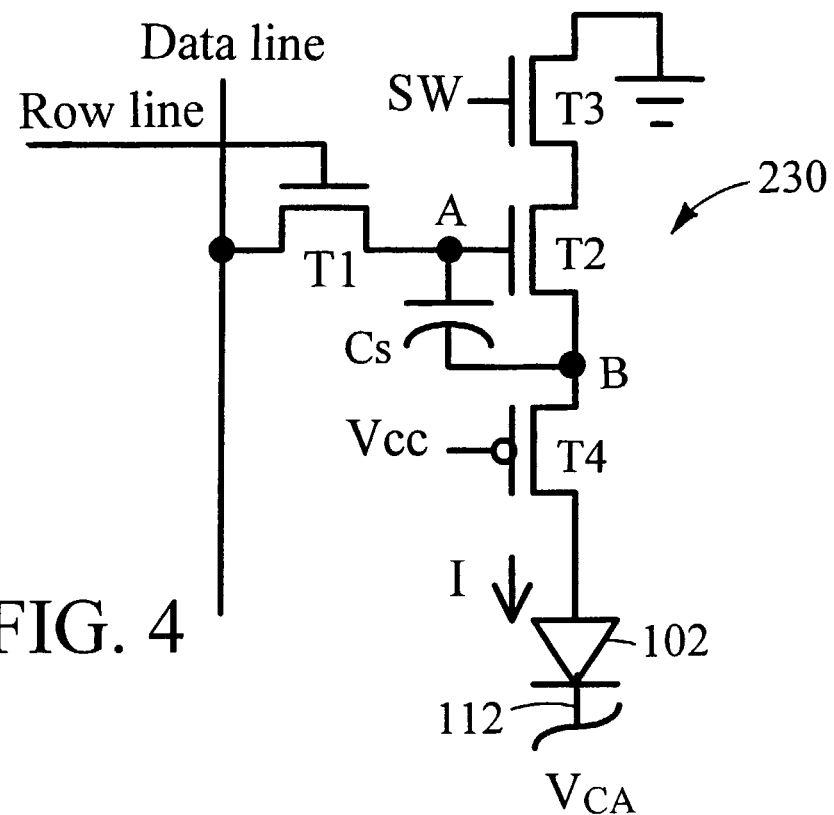

Referring to FIG. 4, another example of a pixel circuit 230 includes the circuit elements of pixel circuit 200 and an additional PMOS transistor T4 that is connected between transistor T2 and OLED 102. The gate of transistor T4 is controlled by a $V_{CC}$ control signal that has a voltage level of about −15V. The signal timings for pixel circuit 230 are the same as the signal timings for pixel circuit 200, which is shown in timing diagrams 130 of FIG. 2.

Referring to FIG. 2, during the write Vt (134) and write data (136) subperiods, because the $V_{CC}$ signal is at about −15V, transistor T4 is switched on hard, meaning that T4 is turned on and operates in its linear region, i.e., Vds<Vgs−$V_{TH4}$, where $V_{TH4}$ is the threshold voltage of transistor T4.

At time t5, the voltage ($V_{CA}$) at cathode 112 is pulled low (162) to a negative voltage (e.g., −23V) lower than the $V_{CC}$ signal. Transistor T4 operates in the saturation region, and functions as a current cascode device that can better isolate the voltage changes of OLED 102 from the voltage at node B. If the mobility of transistor T4 is sufficiently high and the width of transistor T4 is sufficiently large, a smaller voltage error on the storage capacitor due the switching of the cathode voltage at time t5 will result.

Transistor T4 may reduce the voltage swing at node B at the beginning of the expose subperiod 138 as the $V_{CA}$ voltage changes levels. Variations in the characteristics of OLED 102 may modify the voltage at node B as $V_{CA}$ switches voltage levels. One type of variation concerns the relationship between the current I (which corresponds to a user-defined luminance level) flowing through OLED 102 and the OLED voltage (the voltage falling across OLED 102). Regardless of the operation history of OLED 102, the OLED voltage is higher when the current I is higher. Another type of variation concerns the operation history of OLED 102. OLED 102 is a thin film device in which trapped charges can modify the voltage across OLED 102 for a given current. The amount of trapped charges depends upon operation history of OLED 102, and thus, for a given current I, the OLED voltage may change after operating for a period of time.

The gate-to-source voltage of transistor T4 also exhibits similar behavior. However, if the performance of transistor T4 is sufficiently high, then the variations in transistor T4's gate-to-source voltage caused by changes in current or operation history can be less than that of OLED 102, thereby minimizing the voltage error on the storage capacitance $C_S$. Because transistor T4 operates in the saturation region, changes in the gate-to-source voltage is proportional to $$\left(V_{TH4} + \sqrt{I_{OLED} \times \frac{2 \cdot L}{\mu \cdot Cox \cdot W}}\right),$$

where μ represents mobility and Cox represents oxide capacitance. Because transistor T4 has a high W/L ratio, variations in the gate-to-source voltage are low, which result in less threshold voltage drift.

The channel width of transistor T4 is designed to be greater than the channel width of transistor T3 so that for a given current level, the gate-to-source voltage of transistor T4 remains substantially constant. In addition, due to the large channel width of transistor T4, the gate-to-source voltage of transistor T4 would vary less than the variations of the voltage across OLED 102 over desired luminance range, thus reducing the capacitor voltage error due to the cathode voltage switching at t5. Due to the large channel width, the gate-to-source voltage of transistor T4 can be smaller, thereby reducing any electrical stress on T4 and any variations in threshold voltage T4.

Figure 5:
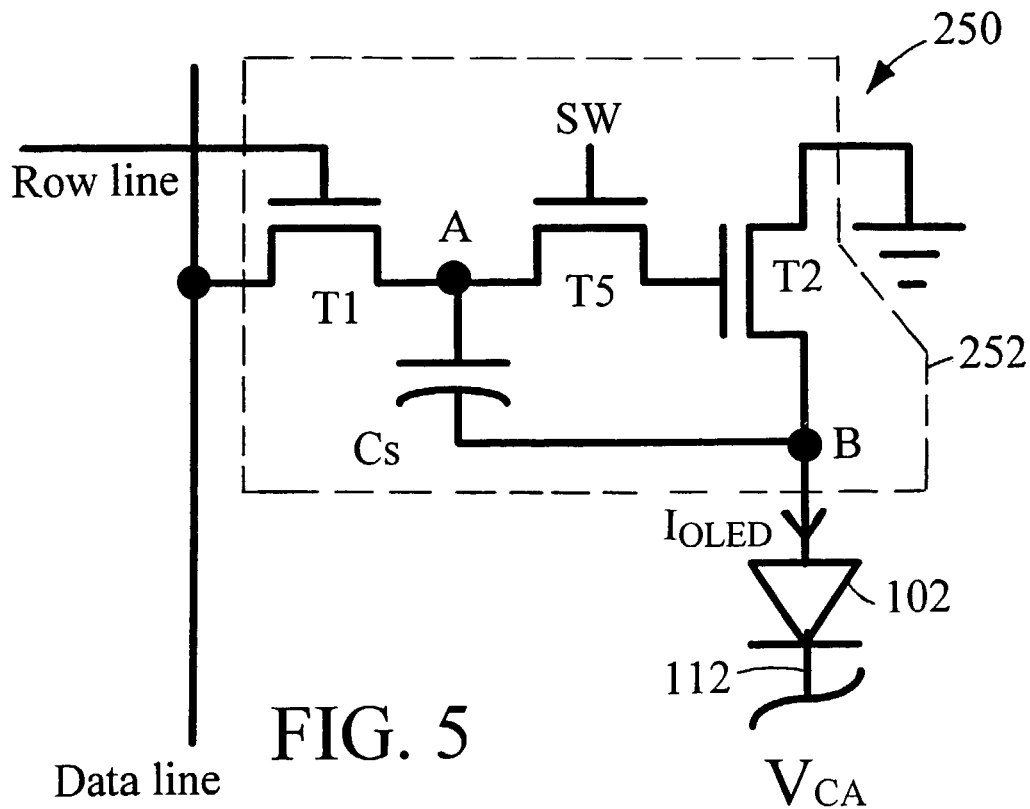

Referring to FIG. 5, another example of a pixel circuit 250 includes a data sampled switched current source 252 and an OLED 102. Data sampled switched current source 252 is similar to data sampled switched current source 120, except that instead of having a transistor T3 connected between ground 122 and the drain of transistor T2, an NMOS transistor T5 is connected between node A and an input (e.g., a gate 254) of driving transistor T2. Transistor T5 is controlled by an SW signal that switches between high and low voltage levels to turn on and off, respectively, transistor T5. The SW signal is common to all pixel circuits in the array.

The signal timings for pixel circuit 250 are the same as the signal timings for pixel circuit 200, which is shown in timing diagrams 130 of FIG. 2. The SW signal is brought low (168) to disconnect transistor T5, thereby decoupling the gate 254 of transistor T2 from node A, when luminance data is written into the capacitor $C_S$. This prevents transistor T2 from conducting while luminance data is written into the capacitor $C_S$, allowing the voltage level of the luminance data to be accurately written into the capacitor $C_S$.

An advantage of pixel circuit 250 is that there is only one transistor (i.e., T2) in series with the OLED 102. Thus, pixel circuit 250 requires a lower voltage to operate than if another transistor were connected in series with the transistor T2. Transistor T2 does not conduct current while data is being written to capacitor $C_S$ since the SW signal is set low during that time period and isolates the gate 254 of transistor T2.

Figure 6:
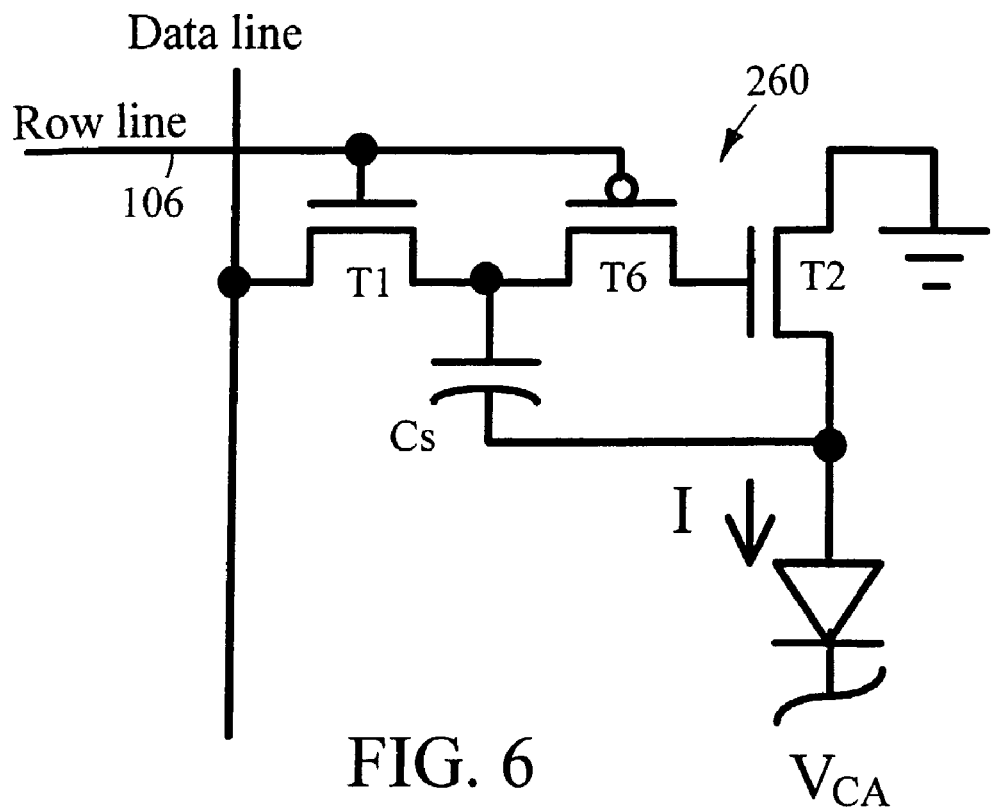

Referring to FIG. 6, another example of a pixel circuit 260 is similar to pixel circuit 250. A PMOS transistor T6 is used instead of the NMOS transistor T5. The SW signal in pixel circuit 250 is eliminated. Transistor T6 is simply controlled by row line 106. Pixel circuit 260 may be useful when poly-silicon is used to construct transistors T1, T2, and T6.

Figure 7:
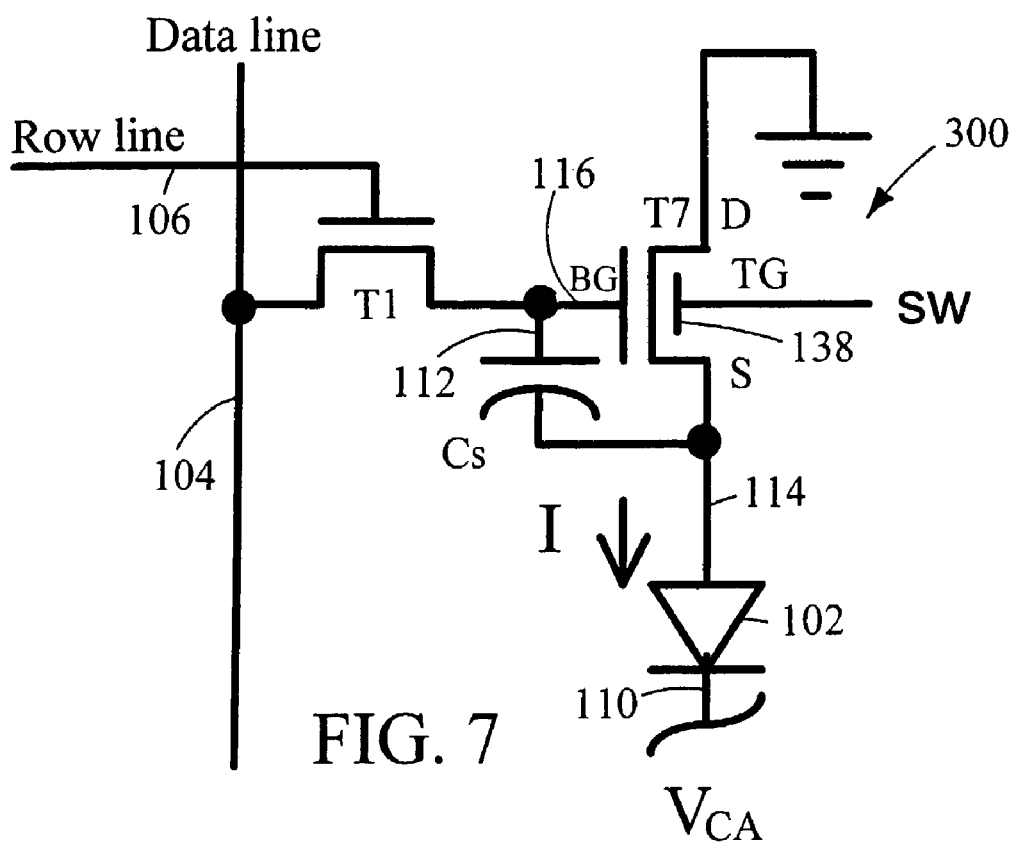
Figure 8:
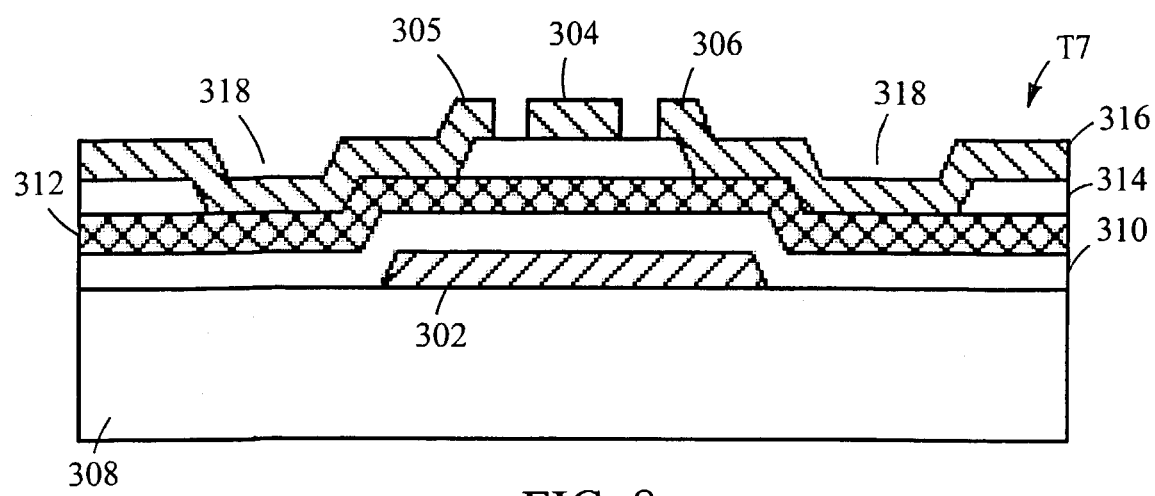
FIG. 8 shows a double gate transistor.

Referring to FIG. 7, a pixel circuit 300 includes a double gate transistor T7 that is used as the driving transistor for driving an OLED 102. The structure of transistor T7 is shown in FIG. 8. Double gate transistor T7 is a thin film transistor that has a bottom gate 302 (which functions as an accumulation gate), a top gate 304 (which functions as a depletion gate), a drain electrode 305, and a source electrode 306.

A double gate transistor is described in "A Novel depletion-gate amorphous silicon thin-film transistor," by B-S Wu et al., IEEE Electron Device Letters, Vol. 13, No. 1, January 1992, pp. 17-19. Referring to FIG. 8, bottom gate 302 operates in a manner similar to the gates of transistors T1 through T6. Bottom gate 302 is formed on top of a substrate 308. Substrate 308 may be made of glass. Above the bottom gate 308 is a dielectric layer 310 and an amorphous silicon layer 312. Above the amorphous silicon layer 312 is another dielectric layer 314. A metal layer 316 is deposited on top of dielectric layer 314 to form drain electrode 305, source electrode 306, and top gate 304. Openings 318 in the dielectric layer 314 allow drain electrode 305 and source electrode 306 to contact the amorphous silicon layer 312.

There is an overlap between the bottom gate 302 and the drain (305) and source (306) electrodes in the vertical direction. When a bottom gate-to-source (Vgs) voltage is greater than a threshold voltage of transistor T7, electrons are attracted to the vicinity of the bottom gate 302 to form a channel that allows current to flow from the drain electrode 305 to the source electrode 306, hence the name "accumulation gate" for bottom gate 302.

Top gate 304 does not overlap drain electrode 305 and source electrode 306. In one example, top gate 304 has a channel length that is smaller than the channel length of bottom gate 302. One theory on the operation of top gate 304 is that, due to the lack of overlap between the gate and the drain/source electrodes, top gate 304 appears to function similar to a depletion gate, and its operation is mostly independent of the thickness of dielectric layers 310 and 314 and the amorphous silicon layer 312.

Table 1 summarizes the influence of the top gate-to-source voltage (Vtgs) on the drain to source current (Ids) of the transistor T7. The voltage Vbgs is the bottom gate-to-source voltage, Vbt is the bottom gate threshold voltage, and Vtt is the top gate threshold voltage. In operation, Vbs is a positive voltage, while Vtt is a negative voltage.

TABLE 1

| Vtgs | Ids | Comment |
| --- | --- | --- |
| Vtgs ≧ 0 | Ids~(Vbgs − Vbt)$^2$ | This applies when transistor T7 operates in saturation mode. T7 has no effect on Ids. |
|  | Ids~(2(Vbgs − Vbt) × Vds − Vds$^2$) | This applies when transistor T7 operates in non-saturation mode. T7 has no effect on Ids. |
| Vtt < Vtgs < 0 | Ids~(Vbgs − Vbt + Vtgs)$^2$ | This applies when transistor T7 operates in saturation mode. Ids is reduced by Vtgs. |
|  | Ids~(2(Vbgs − Vbt + Vtgs) × Vds − Vds$^2$) | This applies when transistor T7 operates in non-saturation mode. Ids is reduced by Vtgs. |
| Vtgs < Vtt | 0 | Channel is pinched off |

Top gate 304 has no effect on the operation of transistor T7 if Vtgs≧0, and shuts off transistor T7 if Vtgs<Vtt. Top gate 304 can be fabricated from the same metal layer as the drain electrode 305 and source electrode 306, and thus the TFT fabrication does not require any additional processing. Additional layers may exist above the TFT, such as an ITO layer, passivation layers, and vias that connection. For example, a dielectric layer may be deposited, chemically polished flat and patterned for additional via connections to subsequently deposited OLEDs for connection to the OLED anode and cathode electrodes.

If organic semiconductors are used for the TFTs, the OLEDs can be deposited below the TFTs. The organic TFTs can be fabricated with low temperature and would not damage the OLEDs that were previously deposited.

Pixel circuit 300 uses the same signal timings as pixel circuit 200 (FIG. 3). Thus, the signal timings shown in timing diagrams 130 (FIG. 2) can be used to control pixel circuit 300. Comparing pixel circuit 300 with pixel circuit 200, the double gate transistor T7 replaces transistors T2 and T3. Top gate 304 of transistor T7 is controlled by an SW signal that switches between two different voltage levels. Simulations have shown that the insensitivity to threshold voltage variations of pixel circuit 300 is as good as or better than that of pixel circuit 200.

In circuit 200, due to stray capacitances between gate and drain of transistor T2 and gate and source of transistor T3, there is voltage coupling between the SW signal and the capacitor $C_S$. When the SW signal switches to high (or low) to turn on (or off) transistor T3, the voltage variations will affect the voltage level at node A, which is connected to a terminal of capacitor $C_S$, thereby affecting the accuracy of the luminance data written into the capacitor $C_S$.

The voltage coupling from the SW signal to the capacitor $C_S$ in pixel circuit 300 is less than the voltage coupling from the SW signal to the capacitor $C_S$ through transistor T2 in pixel circuit 200. This is because the top gate-to-source and the top gate-to-drain capacitances of transistor T7 can be a little as 1/25 of the bottom gate-to-source and bottom gate-to-drain capacitances, respectively. The smaller the stray capacitance is, the lower the voltage coupling.

Pixel circuit 300 uses only two transistors. This design eliminates the voltage drop and electrical stress associated with the use of a third transistor (e.g., transistor T3 of pixel circuit 200 in FIG. 3 or transistor T5 of pixel circuit 250 in FIG. 5). The adverse effect on the pixel circuit due to switching of the SW signal is also reduced.

Operation of pixel circuit 300 may be improved by adjusting the signal voltage levels used to drive pixel circuit 300.

Figure 9:
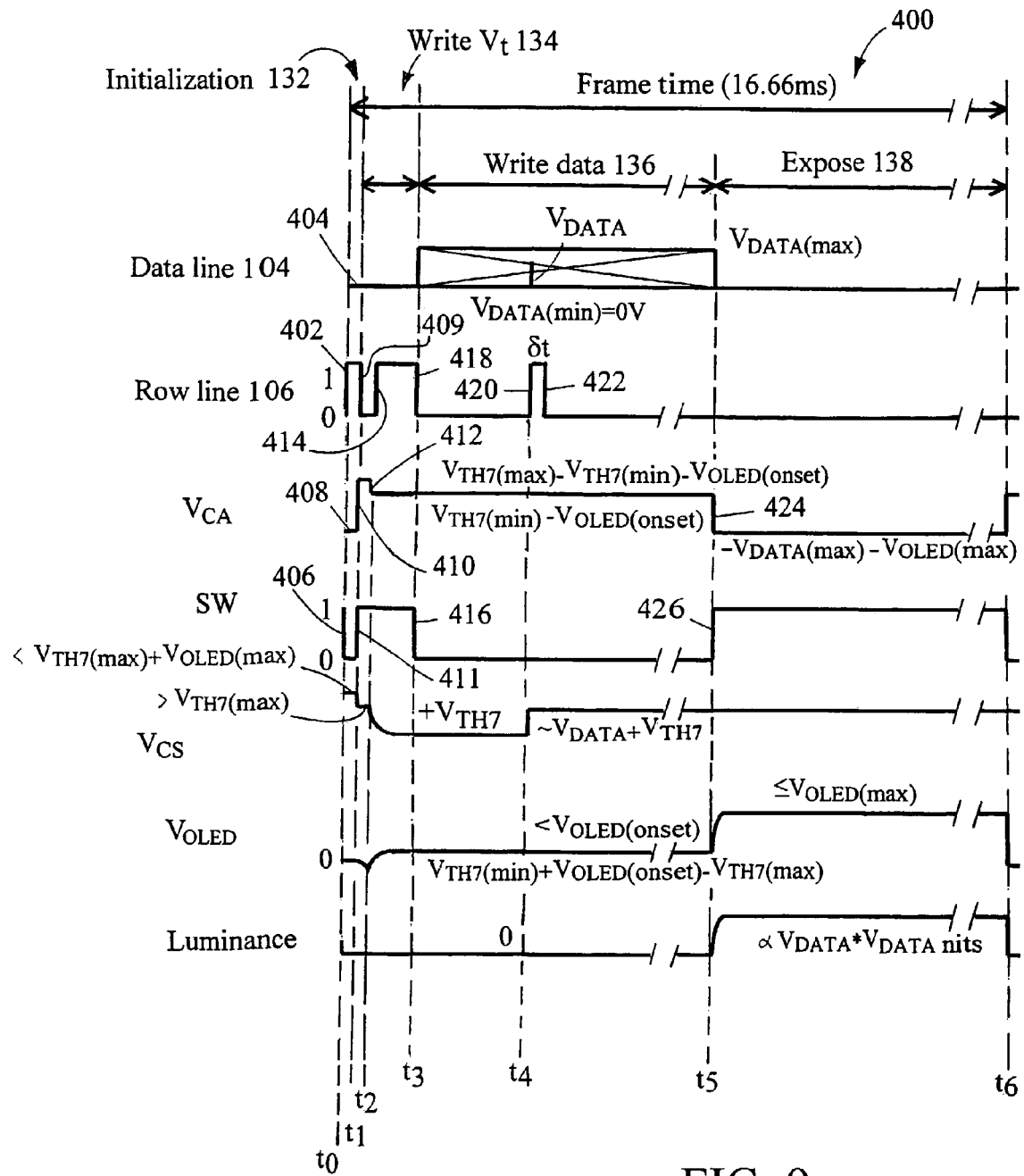

Referring to FIG. 9, timing diagrams 400 illustrate timings of signals that may be used for pixel circuit 300 to reduce OLED cathode voltage ($V_{CA}$) swings by optimizing the signal voltage levels for $V_{CA}$. Timing diagrams 400 illustrate the signal timings during a frame period t_frame, which is divided into four subperiods: an initialization subperiod 132, a write Vt subperiod 134, a write data subperiod 136, and an expose subperiod 138. The initialization subperiod 132 spans a short interval (e.g., 10 µs) from time t0 to t1, the write Vt subperiod 134 spans from time t1 to t3, the write data subperiod 136 spans from time t3 to t5, and the expose subperiod 138 spans from time t5 to t6. The write Vt subperiod 134 includes two intervals: the first interval from time t1 to t2, and the second interval from time t2 to t3.

The signal timings of timing diagrams 400 minimize the $V_{CA}$ voltage swings, and is designed by first determining the most negative cathode voltage allowed during time t2 to t3, and then determining the cathode voltage needed during time t1 to t2.

In timing diagrams 400, the signal level of row line 106 switches between a logical '1' and a logical '0'. For row line 106, a logical '1' means that the voltage level is sufficiently high so that transistor T1 is turned on, and a logical '0' means that the voltage level is sufficiently low so that transistor T1 is turned off. The signal level of the SW signal also switches between a logical '1' and a logical '0'. For the SW signal, a logical '0' means that the voltage level is sufficiently low so that transistor T7 is turned off, and a logical '1' means that the voltage level is sufficiently high so that transistor T1 can supply the maximum current if Vbgs of transistor T7 is also high.

The signal level for data line 104 ranges from $V_{DATA}$(min) to $V_{DATA}$(max). $V_{DATA}$(min) refers to the lowest voltage level for luminance data. In the example illustrated, $V_{DATA}$(min) can be ground voltage or 0V. $V_{DATA}$(max) refers to the voltage level for luminance data that represents the brightest luminance level of a pixel.

The OLED cathode voltage, $V_{CA}$, may have three voltage levels, represented as a function of $V_{TH7}$(min), $V_{TH7}$(max), $V_{OLED}$(onset), and $V_{OLED}$(max). $V_{TH7}$(min) refers to the initial or minimum threshold voltage of transistor T7. $V_{TH7}$(max) refers to the maximum or end-of-life threshold voltage of T7. $V_{OLED}$(onset) refers to the voltage across OLED 102 at onset of luminance or conduction of the OLED. In one example, $V_{OLED}$(onset) is 2V. $V_{OLED}$(max) refers to the voltage level across OLED 102 when it is driven at its maximum luminance level.

In the following description, an equivalent circuit 500 is used to explain the operation of pixel circuit 300 (FIG. 7) during the initialization subperiod 132 when the signal timings in timing diagrams 400 are applied. Equivalent circuits 510 and 520 are used to explain the operation of pixel circuit 300 during the first and second intervals, respectively, of the write Vt subperiod 134 when the signal timings in timing diagrams 400 are applied.

Figure 10:
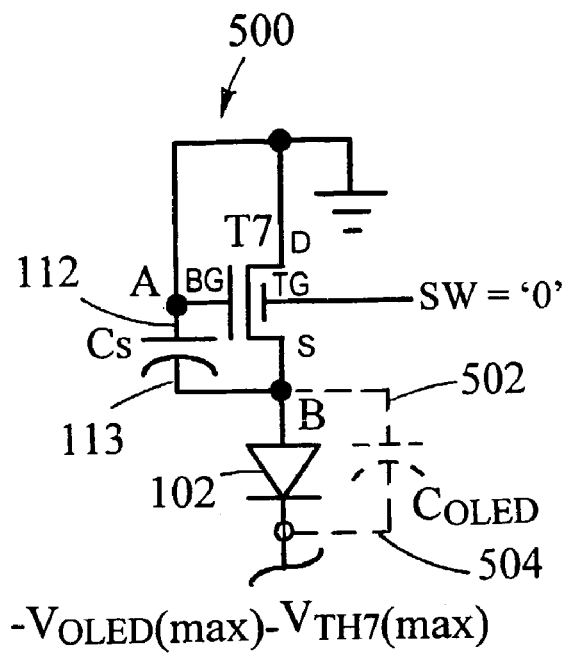
FIGS. 10-14 show equivalent circuits.

Referring to FIG. 10, equivalent pixel circuit 500 shows the equivalent circuit for pixel circuit 300 during the initialization subperiod 132 (which is from time t0 to t1). The signal timings during the initialization subperiod 132 are applied to pixel circuit 300 at the beginning of the first frame after display 700 is powered up. The purpose of the initialization subperiod 132 is to ensure that at the beginning of the write Vt subperiod 134, the voltage across capacitor $C_S$ is larger than $V_{TH7}$ so that the transistor T7 can conduct to discharge the capacitor $C_S$ until $V_{CS}$ is substantially the same as $V_{TH7}$. In one example, the signal timings for the initialization subperiod 132 are not repeated at the beginning of subsequent frames because the leakage current of transistor T1 tends to increase the voltage across capacitor $C_S$. This allows $V_{CS}$ to be larger than $V_{TH7}$ so that transistor T7 can conduct to set the $V_{CS}$ to $V_{TH7}$ during the write Vt subperiod 134.

At time t0, row line 106 is set (402) to a logical '1' to turn on transistor T1. Data line 104 is set (404) to $V_{DATA}$(min) or 0V. This combination is equivalent to grounding the bottom gate BG (302) of transistor T7, or setting the voltage at capacitor $C_S$'s positive terminal 112 to 0V. The SW signal (applied to the top gate TG (304) of transistor T7) is set (406) to logical '0' so that transistor T7 does not conduct current. This prevents current from flowing to OLED 102 so that the OLED is not turned on during the initialization subperiod 132.

During the initialization subperiod 132, the cathode voltage ($V_{CA}$) is set (408) to a voltage level more negative than $-V_{TH7}$(max). For example, $V_{CA}$ may be set to:

$$V_{CA} = -V_{TH7}(\max) - V_{OLED}(\max). \quad \text{(Eq. 5)}$$

OLED 102 has a capacitance represented by $C_{OLED}$, shown in dashed lines. Capacitor $C_{OLED}$ is about 10 times larger than capacitor $C_S$. Because capacitor $C_{OLED}$ will have 0V across its terminals (502 and 504) upon power up, the voltage ($V_{CS}$) across the capacitor $C_S$ will be:

$$V_{CS} \sim |V_{CA}| = |-V_{OLED}(\max) - V_{TH7}(\max)|. \quad \text{(Eq. 6)}$$

At time t1, row line 106 is set (409) to logical '0' and the SW signal is set (411) high.

Figure 11:
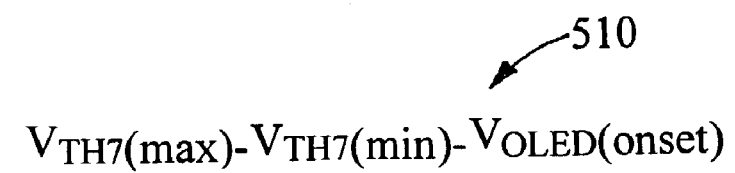
Figure 11:
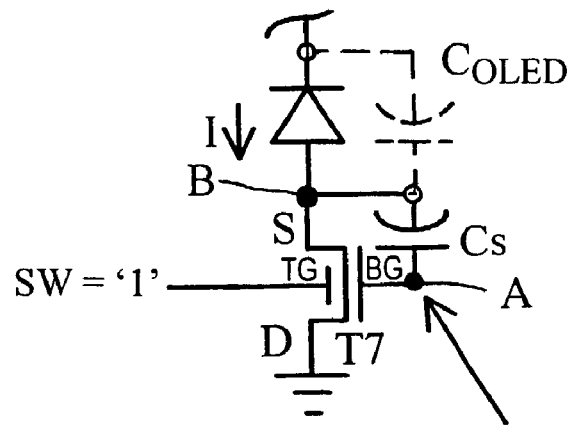

Referring to FIG. 11, equivalent pixel circuit 510 shows the equivalent circuit for pixel circuit 300 during the interval from time t1 to t2.

At time t1, voltage $V_{CA}$ is also set (410) to $$V_{CA} = V_{TH7}(\max) - V_{TH7}(\min) - V_{OLED}(\text{onset}). \quad \text{(Eq. 7)}$$

The value of $V_{CA}$ is set to a voltage level to assure that a voltage of at least $V_{TH7}$(max) is developed across capacitor $C_{OLED}$ at time t2. For an amorphous silicon display having a long operating lifetime, $V_{TH7}$(max)−$V_{TH7}$(min)−$V_{OLED}$(onset) may be a positive voltage. Because the cathode voltage ($V_{CA}$) is positive, current flows from source S to drain D of transistor T7.

An advantage of using positive $V_{CA}$ is that transistor T7's gate-to-drain and drain-to-source voltages are reversed. Charges trapped between drain and source or between gate and drain are removed, thereby reducing degradation of transistor T7, reducing the variation rate of the T7's threshold voltage.

At time t1, the voltage at the bottom gate BG (302) of transistor T7 is:

$$\text{Vbg} = V_{OLED}(\max) - V_{OLED}(\text{onset}) + 2 \times V_{TH7}(\max) - V_{TH7}(\min). \quad \text{(Eq. 8)}$$

The SW signal is set (411) to logical '1' to allow transistor T7 to conduct. Transistor T7 conducts until the OLED anode 114 becomes 0V, and the voltage across OLED 102 becomes:

$$V_{OLED}=V_{TH7}(\min)+V_{OLED}(\text{onset})-V_{TH7}(\max). \quad (\text{Eq. 9})$$

The interval between time t1 and t2 is about 100 µs.

Figure 12:
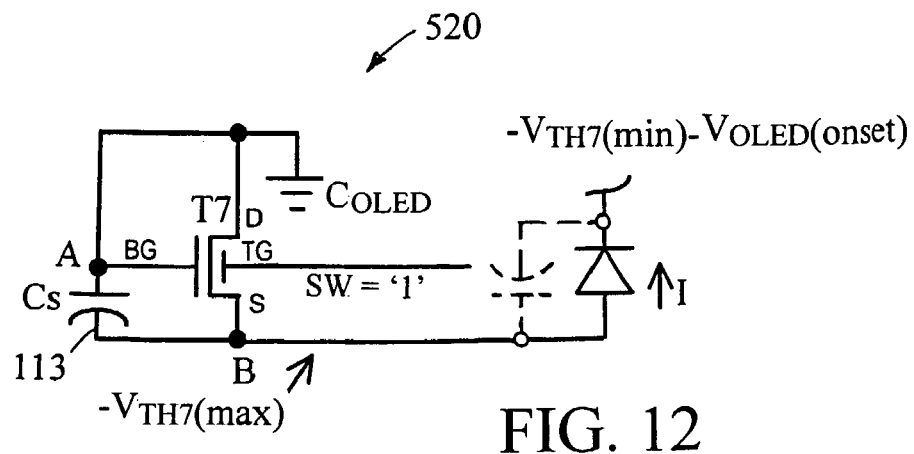

Referring to FIG. 12, an equivalent pixel circuit 520 shows the equivalent circuit for pixel circuit 300 during the interval from t2 to t3.

At time t2, the voltage $V_{CA}$ is set (412) to $$V_{CA}=-V_{TH7}(\min)-V_{OLED}(\text{onset}). \quad (\text{Eq. 10})$$

This is the most negative voltage allowable for $V_{CA}$ that will not cause OLED 102 to illuminate. The reason is as follows: Because node B (connected to the source electrode 305 of transistor T7) will have a value of $-V_{TH7}$ at the end of the write Vt subperiod 134, the $V_{CA}$ voltage is set to be $V_{OLED}$ (onset) volts lower than $-V_{TH7}$. Because $V_{TH7}$ can range from $V_{TH7}(\min)$ to $V_{TH7}(\max)$, to ensure that OLED 102 is not turned on when the transistor T7 has only been operating for a short period of time (meaning that $V_{TH7}=V_{TH7}(\min)$), the $V_{CA}$ voltage is set to $-V_{TH7}(\min)-V_{OLED}(\text{onset})$.

The initial voltage at the negative terminal 113 of capacitor $C_S$ is $-V_{TH7}(\max)$. Row line 106 is set (414) to a logical '1' so that the bottom gate BG (302) of transistor T7 is connected to data line 104, which is at $V_{DATA}(\min)$ or 0V. The SW signal remains at a logical '1', allowing transistor T7 to conduct current. T7 conducts until the voltage across capacitor $C_S$ is about $V_{TH7}$, which is transistor T7's present threshold voltage. $V_{TH7}$ can be any value between $V_{TH7}(\min)$ and $V_{TH7}(\max)$. The interval between time t2 and t3 is about 500 µs.

The smaller the voltage difference between $V_{TH7}$ and the voltage level of $V_{CA}$ at time t2, the shorter the time required for $V_{CA}$ to settle to $V_{TH7}$. Thus, in order to reduce the interval between time t2 and t3, the level of $V_{CA}$ at time t2 should be as low as possible but still higher than the highest possible $V_{TH7}$ value, which is $V_{TH7}(\max)$. In the example illustrated in FIG. 9, $V_{CA}$ is set to $V_{TH7}(\max)-V_{TH7}(\min)-V_{OLED}(\text{onset})$ between time t1 to t2 so that $V_{CA}$ is equal to $V_{TH7}(\max)$ just prior to time t2. Reducing the interval between time t2 and t3 will allows more time for the write data subperiod 136 and the expose subperiod 138.

At time t3, the SW signal is set (416) to a logical '0'. Row line 106 is set (418) to logical '0'.

Figure 13:
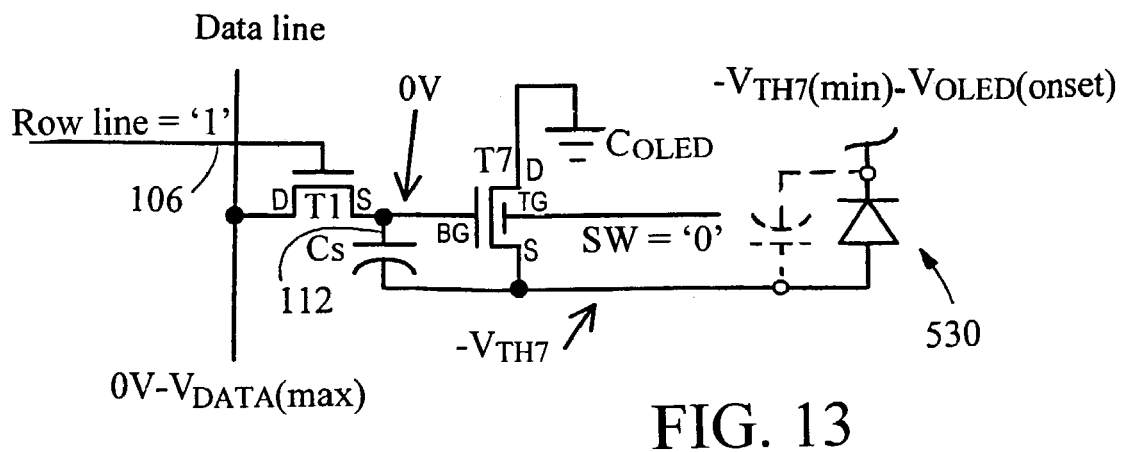

Referring to FIG. 13, an equivalent pixel circuit 530 shows the equivalent circuit for pixel circuit 300 during the interval from time t4 to t4+δt, where δt is the short time interval during which $V_{DATA}$ is written into the capacitors $C_S$ of a row of pixel circuits. In one example, δt can be less than 10 µs.

At time t4, row line 106 is set (420) to a logical '1', and luminance data ($V_{DATA}$) is written into capacitor $C_S$, which is connected to $C_{OLED}$. Because capacitor $C_{OLED}$ is large compared to the capacitor $C_S$, the negative terminal 113 of capacitor $C_S$ is maintained at about $-V_{TH7}$ while $V_{DATA}$, which is a positive voltage, is written onto the positive terminal 112 of capacitor $C_S$. Row line 106 is set (422) to a logical '0' at time t4+δt. During time t4 to t5, the SW signal remains at logical '0' so that transistor T7 does not conduct when $V_{DATA}$ is written into capacitor $C_S$.

The capacitor $C_{OLED}$ is finite, and is about ten times larger than the capacitor $C_S$. When data line 104 (having a voltage level $V_{DATA}$) charges capacitor $C_S$, OLED 102 is charged as well, so the data voltage ($V_{DATA}$) falls across both capacitors $C_S$ and $C_{OLED}$. As a result, only a portion (about 90% or $(1-C_S/C_{OLED} \times 100\%))$ of $V_{DATA}$ is actually written into capacitor $C_S$.

Figure 14:
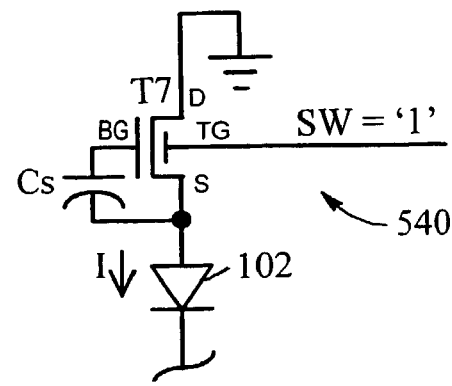

Referring to FIG. 14, an equivalent pixel circuit 540 shows the equivalent circuit for pixel circuit 300 during the interval from time t5 to t6.

At time t5, the $V_{CA}$ voltage is set (424) to $$V_{CA}=-V_{OLED}(\max)-V_{DATA}(\max). \quad (\text{Eq. 11})$$

The SW signal is set (426) to a logical '1', turning on transistor T7, causing current I to flow from transistor T7 to OLED 102. OLED illuminates at a luminance level proportional to the current I, which is proportional to $V_{DATA}^2$, and is almost independent of the threshold voltage of transistor T7. The effect of a threshold voltage difference between two pixel circuits in the display can be reduced to less than 5% with $V_{DATA}=10V$. When the possible voltage level range of $V_{DATA}$ is increased (i.e., $V_{DATA}(\max)-V_{DATA}(\min)$ is increased), the current variations among different pixels due to threshold voltage variations will be decreased.

Transistor T7 operates in the saturation region because its drain-to-source voltage is greater than its gate-to-source voltage minus its threshold voltage. TFT degradation is less severe when the transistor operates in the saturation region than when it operates in the linear region.

OLED 102 illuminates until time t6. The cycle of signal timings from time t1 to t6 is repeated for successive frames.

Passive matrix OLED displays having row or column cathode lines. By comparison, the OLED cathode is common to all pixels in active matrix OLED displays. Thus, the cathode voltage $V_{CA}$ is common to all pixels. Common cathode fabrication process is simpler and lower in cost since via connections to cathode are not required. Also, power distribution is more efficient when a common or two dimensional cathode structure is used since power can be brought in from the top, bottom, left and right sides of the display. Row or column cathode distribution has more resistance than a two dimension plane structure and are not as efficient. Cathode connection vias are not required when a common cathode is used. Because the signal timing of the SW signal is linked to the cathode voltage timing, the SW signal may also be common to all pixels (i.e., all pixel circuits have the same SW signal). Using a single SW signal and a single $V_{CA}$ voltage that are common to all pixels allows the sequence of write Vt, write data, and expose subperiods to occur at the same time for all pixels. This simplifies the row and column driving circuits and the fabrication of the active matrix OLED array.

In pixel circuit 300, the gate-to-source terminal capacitances of transistor T1 that are connected to the positive terminal 112 of capacitor $C_S$ can modify the voltage level of capacitor $C_S$ when row line 106 switches from a logical '1' to a logical '0' in the write data subperiod (at time t4+δt). The voltage across capacitor $C_S$ can also be modified when $V_{CA}$ changes at the beginning of the expose subperiod (at time t5) due to transistor T1's gate-to-source capacitance and T7 bottom gate to drain capacitance. In simulations, the voltage errors in $V_{CS}$ due to coupling may be as large as 2V. One way to reduce voltage coupling is to reduce the width of thin film transistors T7 and T1 to reduce T7's bottom gate-to-drain and T1's gate-to-source capacitances. Using a larger data voltage range will allow reduction in transistor T7's width (because with a higher Vgs, which is equal to $V_{DATA}+V_{TH7}$, the same current I can be achieve with a smaller channel width), but may require an increase in transistor T1's width (because a larger channel width for transistor T1 is needed to charge capacitor $C_S$ to the higher data voltage level within δt).

In FIG. 13, the storage capacitor voltage ($V_{CS}$) is reduced due to row line switching, i.e., due to coupling from gate-to-source stray capacitance Cgs of transistor T1 as row line 106 is switched from a logical '1' to a logical '0'. This reduction of $V_{CS}$ is referred to as "row line switching coupling." The amount of voltage reduction is $$\frac{(V_{ROW}('1') - V_{ROW}('0')) \times C_{OLED} \times Cgs1}{(Cgs1 + Cgd7) \times (C_{OLED} + C_S + Cgs7) + C_{OLED} \times (C_S + Cgs7))}, \quad \text{(Eq. 12)}$$

where $V_{ROW}('1')$ and $V_{ROW}('0')$ are the row line voltages at logical '1' and '0', respectively; Cgs1 and Cgs7 are the gate-to-source capacitances of transistors T1 and T7, respectively; capacitance Cgd7 is transistor T7's gate-to-drain capacitance. Assuming that $C_{OLED}$ is much larger than $C_S$, Cgd7, Cgs7, and Cgs1, the equation above can be simplified as $$\frac{(V_{ROW}('1') - V_{ROW}('0')) \times Cgs1}{Cgs1 + Cgd7 + C_S + Cgs7}. \quad \text{(Eq. 13)}$$

The voltage $V_{ROW}('1')$ is designed to be greater than $V_{DATA}(\max)+V_{TH1}(\max)$, where $V_{TH1}(\max)$ is the end of life maximum threshold voltage for transistor T1. The voltage $V_{ROW}('0')$ has a level such that $$V_{ROW}('0') \leftarrow V_{OLED}(\max) - V_{DATA}(\min) + V_{OLED}(\text{on-set}) + V_{TH7}(\min) + V_{TH1}(\min). \quad \text{(Eq. 14)}$$

The value of $V_{ROW}('0')$ is designed so that the voltage difference between row line 106 and $V_{CA}$ does not cause transistor T1 to be turned on during the expose subperiod 138.

In FIG. 14, the storage capacitor voltage ($V_{CS}$) is increased by the switching of the $V_{CA}$ voltage. This increase of $V_{CA}$ is referred to as "cathode voltage switching coupling." The amount of voltage increase is $$\frac{(V_{OLED}(\max) + V_{DATA}(\max) - V_{TH7}(\min) - V_{OLED}(\text{onset})) \times C_{OLED} \times (Cgs1 + Cgd7)}{(C_{OLED} + Cgs1 + Cgd7) \times (C_S + Cgs7) + C_{OLED} \times (Cgs1 + Cgd7)}. \quad \text{(Eq. 15)}$$

Assuming that $C_{OLED}$ is much larger than $C_S$, Cgd7, Cgs7, and Cgs1, the equation above can be approximated as $$(V_{OLED}(\max) + V_{DATA}(\max) - V_{TH7}(\min)) \times \frac{Cgs1 + Cgd7}{C_S + Cgs7 + Cgs1 + Cgd7}. \quad \text{(Eq. 16)}$$

This voltage coupling is large and tends to produce off-state luminance (i.e., the OLED 102 illuminates even when the pixel is supposed to be off, such as when $V_{DATA}=0V$).

The row line switching coupling tends to reduce the storage capacitor voltage $V_{CS}$ by the amount shown in Eq. 13, and the cathode voltage switching coupling tends to increase the storage capacitor voltage $V_{CS}$ by the amount shown in Eq. 16. It is possible to design pixel 300 circuit so that the voltage errors in $V_{CS}$ due to the two types of voltage couplings cancel each other. To achieve this, the $V_{CA}$ voltage swing is designed to be about Cgs1/(Cgs1+Cgd7) of the row line voltage swing.

For example, if transistors T1 and T7 have about the same size (i.e., same widths and lengths), Cgs1≈Cgd7, thus the row line voltage swing needs to be about twice the amount of the $V_{CA}$ voltage swing. The minimum allowable $V_{CA}$ voltage swing is $$V_{DATA}(\max) - V_{TH7}(\min) + V_{OLED}(\max) - V_{OLED}(\text{on-set}). \quad \text{(Eq. 17)}$$

Thus, in order to reduce the row line voltage swing while still achieving cancellation of the two types of voltage couplings, it may be necessary to increase the size of transistor T1 relative to transistor T7.

In one example of designing pixel circuit 300, transistor T7's W/L ratio is determined by $V_{DATA}(\max)$ and the amount of OLED current needed for achieving the desired luminance range. Transistor T1's W/L is determined by the time available for charging capacitor $C_S$ within a row ($\delta t$). Thus, in order that the row line switching coupling be sufficient to cancel the cathode voltage switching coupling, transistor T1's W/L may be designed to be larger than the size required to charge capacitor $C_S$ as defined by the row time.

In timing diagrams 400, the $V_{CA}$ voltage is switched among three different voltage levels, as shown in Eqs. 7, 10, and 11. The switching of $V_{CA}$ voltage can be simplified by using an additional transistor to directly control the OLED anode voltage.

Figure 15:
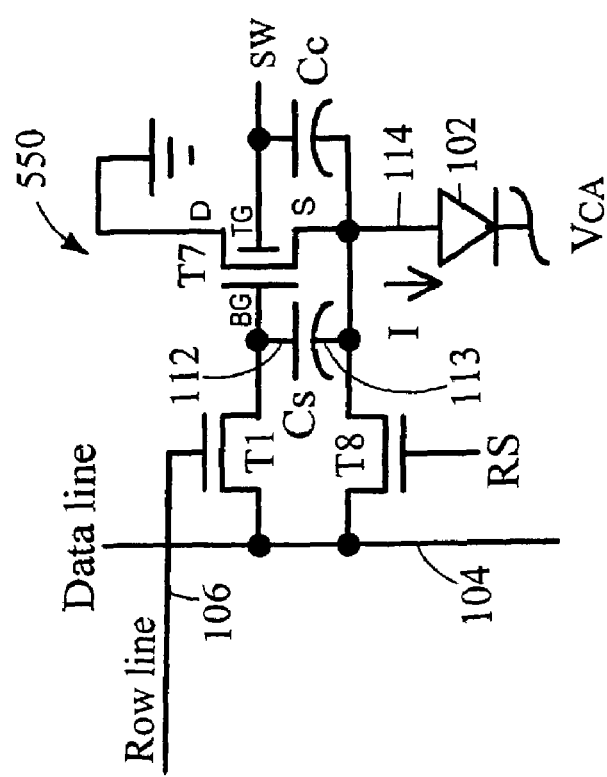

Referring to FIG. 15, an example of a pixel circuit 550 is similar to pixel circuit 300 (FIG. 7), with an additional transistor T8 connected between data line 104 and the negative terminal 113 of capacitor $C_S$. Transistor T8 is controlled by an "RS" signal.

Figure 16:
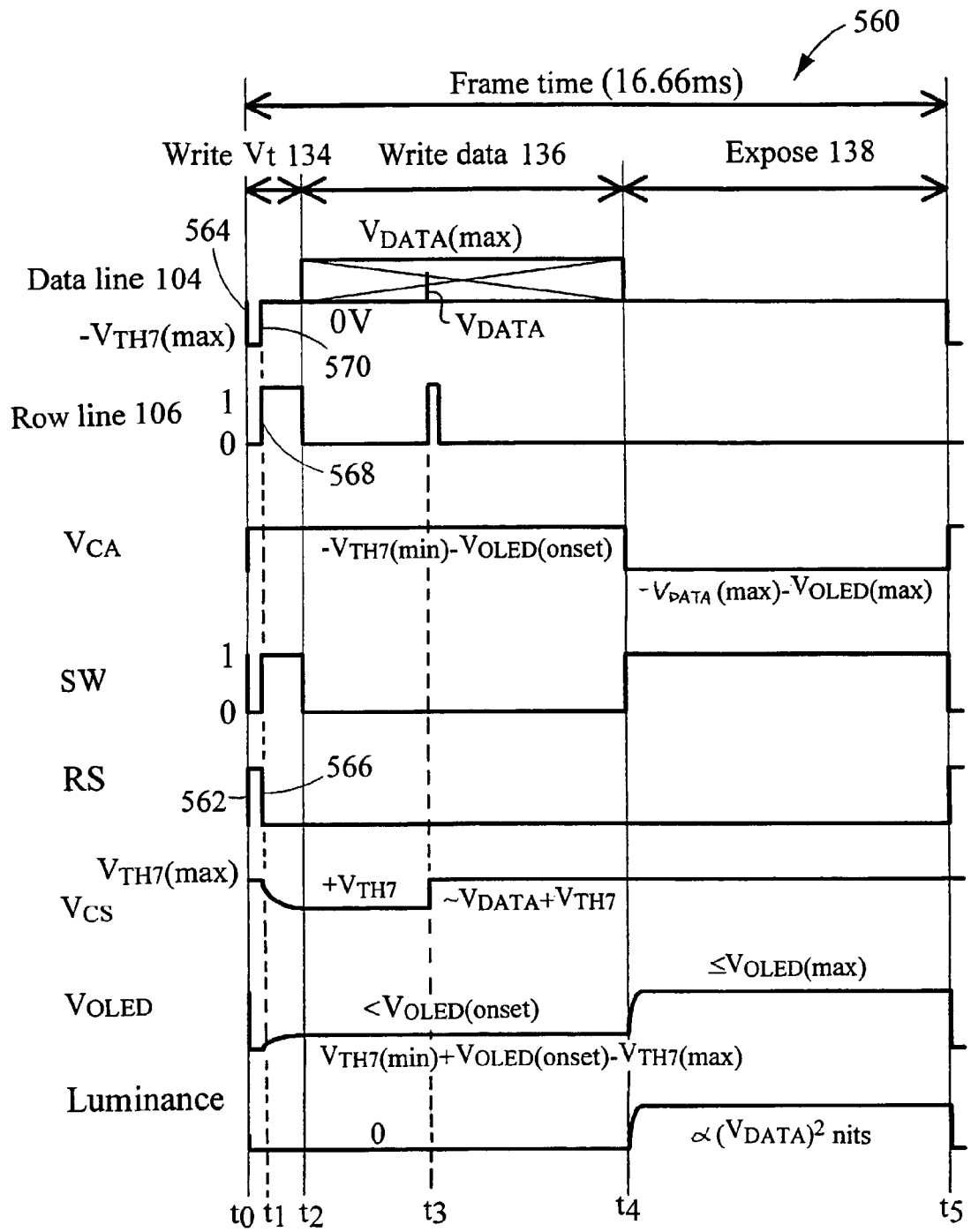

Referring to FIG. 16, timing diagrams 560 show timings of signals that are used to drive pixel circuit 550. Timing diagrams 560 show signal timings during a frame time t_frame, which is divided into a write Vt subperiod 134, a write data subperiod 136, and an expose subperiod 138. The write Vt subperiod 134 spans from time t0 to t1, the write data subperiod 136 spans from time t2 to t4, and the expose subperiod 138 spans from time t4 to t5. For simplicity of illustration, an initialization subperiod is omitted in timing diagrams 560.

At time t0, the RS signal is set (562) to a logical '1', and data line 104 is set (564) to $-V_{TH7}(\max)$. This turns on transistor T8, causing anode 114 of OLED 102 to be set to the data line voltage, $-V_{TH7}(\max)$. The cathode voltage $V_{CA}$ is set to $$V_{CA} = -V_{TH7}(\min) - V_{OLED}(\text{onset}) \quad \text{(Eq. 18)}$$

during the write Vt subperiod 134. This simplifies the switching of $V_{CA}$ to just two voltage levels.

At time t1, the RS signal is set (566) to a logical '0', while row line 106 is set (568) to a logical '1', and data line 104 is set (570) to 0V. This turns on transistor T1, causing the positive terminal 112 of capacitor $C_S$ to be set to the data line voltage level, 0V.

By using the two-step sequence of setting the negative terminal 113 of capacitor $C_S$ to $-V_{TH7}(\max)$ then setting the positive terminal 112 of capacitor $C_S$ to 0V, the write Vt subperiod 134 in timing diagrams 560 can be made shorter than the write Vt subperiod 134 of timing diagrams 400. The second and third steps of write Vt subperiods 134 in timing diagrams 400 are combined into one step in timing diagrams 560. Because $V_{CA}$ does not have to go above $-V_{TH7}(\min) - V_{OLED}(\text{onset})$, the $V_{CA}$ voltage swing can be reduced, thereby reducing the amount of cathode voltage switching coupling.

Optionally, a capacitor $C_C$ may be connected between the top gate TG (304) and the source electrode 305 of transistor T7. Because the SW signal is switched from logical '0' to '1' at the beginning of the expose subperiod 138, the voltage coupling from top gate TG (304) to the anode 114 of OLED 102 through capacitor $C_C$ tends to increase the OLED anode voltage, thereby helping to cancel out the effects of cathode voltage switching coupling.

By using the capacitor $C_C$, the width of transistor T1 can be made smaller, and the voltage difference between logical '1' and '0' states for row line 106 can be reduced. The SW signal can switch to a wider range of voltages above transistor T7's source voltage without affecting transistor T7's operating characteristics.

To avoid the need to place a $-V_{TH7}$(max) voltage on data line 104 (which tends to complicate the data drivers 712 and display controller 720), the drain of transistor T8 can be connected to a separate control voltage.

Figure 17:
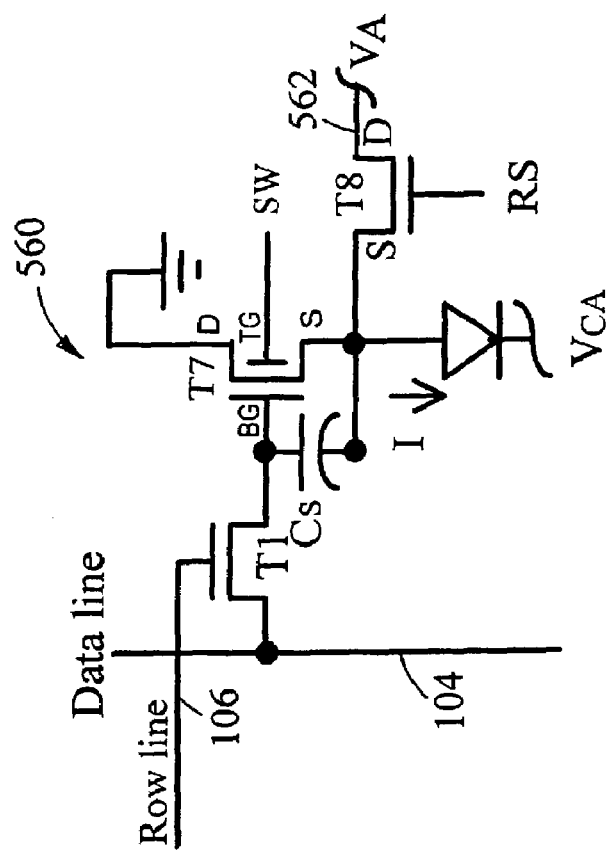

Referring to FIG. 17, an example of a pixel circuit 560 includes a transistor T8 with its drain 562 connected to a control voltage $V_A$. The control voltage $V_A$ is fixed at $-V_{TH7}$ (max), and may be common to all pixels in the display 700.

Figure 18:
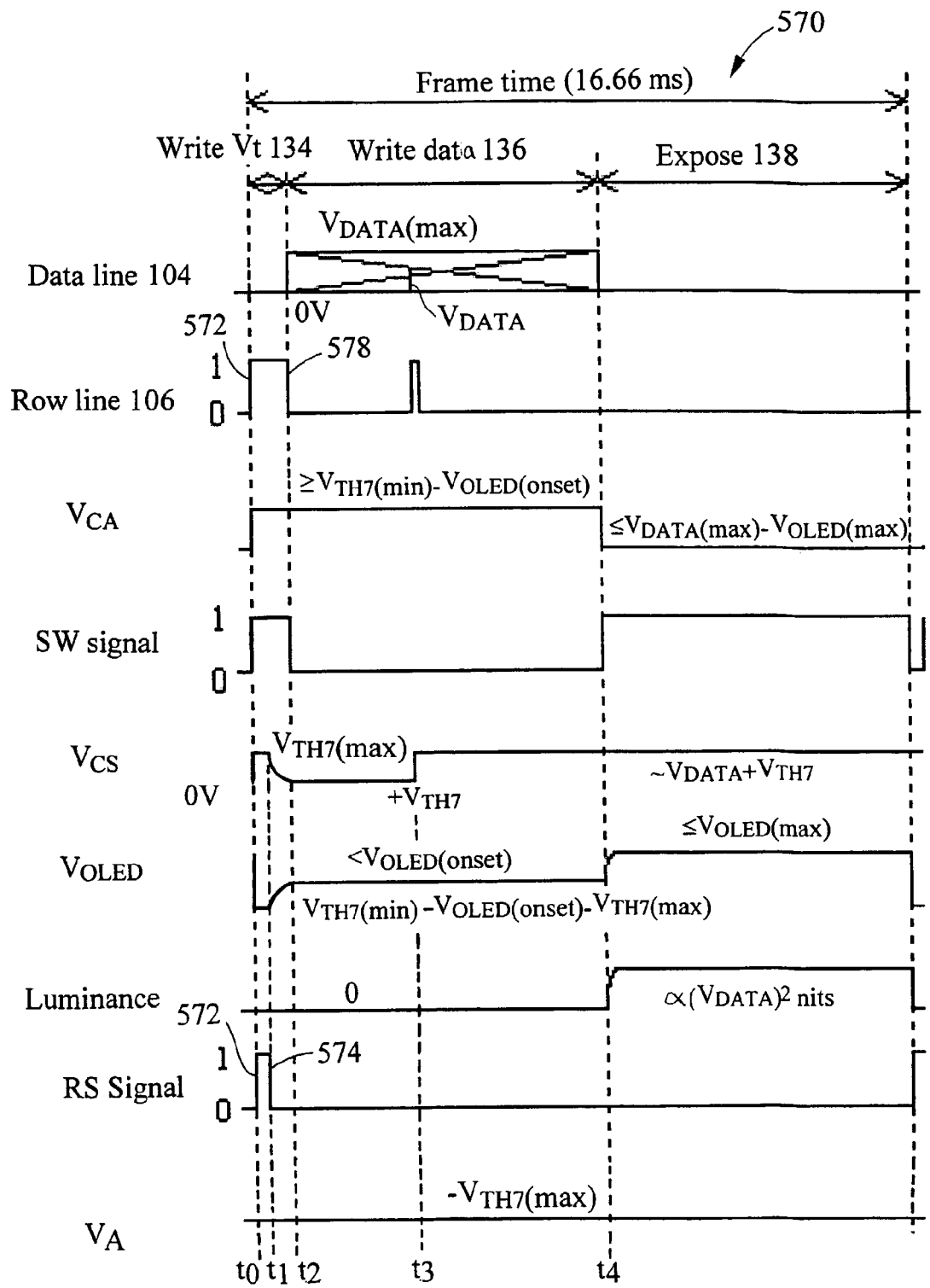

Referring to FIG. 18, timing diagrams 570 show the signal timings for pixel circuit 560. At time t0, while the voltage of data line 104 is at 0V and the $V_{CA}$ voltage is set to $$V_{CA} = -V_{TH7}(\min) - V_{OLED}(\text{onset}),\qquad(\text{Eq. 19})$$

and the RS signal and row line 106 are set (572) to logical '1' simultaneously. In one step, the voltage across capacitor $C_S$ is set to $V_{TH7}$(max).

At time t1, the RS signal is set (574) to logical '0'. Transistor T7 charges capacitor $C_S$ until the voltage across $C_S$ is equal to $V_{TH7}$, the current threshold voltage of transistor T7.

At time t2, row line 106 is set (578) to logical '0' to decouple capacitor $C_S$ from data line 104.

In some examples of active matrix OLED displays, due to the design of the display controller (e.g., 720) or other considerations, it may not be possible to compensate for voltage coupling errors by optimizing voltage swings or widths and lengths of the thin film transistors, or by using the capacitor $C_C$ as shown in FIG. 15. There are two alternatives to compensating the voltage coupling error.

One alternative is to shift the data voltage range relative to the other pixel circuit control voltages by an amount substantially the same as the voltage coupling error. For example, in the pixel circuits shown in FIGS. 1, 3, 4, 6, 7, 8 and 16, the data drivers 712 for driving data line 104 may have a ground voltage level that is different from the ground voltage level of the other circuits in the display 700. If the cathode voltage switching coupling (which tends to reduce $V_{CS}$, the voltage across capacitor $C_S$) is larger than the row line switching coupling (which tends to increase $V_{CS}$), the voltage level of data line 104 may be shifted lower so as to compensate for the cathode voltage switching coupling.

Another alternative is to raise the ground terminal and the $V_{CA}$ voltage levels used by the pixel circuits relative to the voltage range of data line 104 by an amount equal to the voltage error in $V_{CS}$ due to voltage coupling.

In both alternative approaches, using the examples of the pixel circuits described above, the voltage level of data line 104 during the write Vt subperiod is set to 0V or to the coupling voltage error, and not to $V_{DATA}$(min).

Below are simulation result of the pixel circuits 100, 200, and 250. The simulation conditions are such that a maximum average luminance of 300 cd/m² was obtained. A circuit simulator that is similar to SPICE was used to obtain transient responses for multiple frame periods. The data line voltages were incremented in 1.25V or 2.5V steps over a 0 to 10V range. The OLED model used in the simulation has a luminous efficiency of 4 cd/A and achieves 500 cd/m² at a forward voltage of about 7V. The turnoff and reverse bias currents are low enough so as not to effect circuit operation.

A transistor model for typical amorphous NMOS transistors having an initial threshold voltage (Vti) of 2.5V was used in the simulations. The transistor channel length for all transistors were 8 microns. The channel width of transistor T1 was 48 microns in pixel circuits 100, 200, and 250. The channel widths of transistors T2, T3, and T5 were 64, 48 and 48 microns, respectively. Capacitor $C_S$ was 500 fF. The duration of the row line pulse δt during the write data subperiod was about 10 microseconds.

Figure 19:
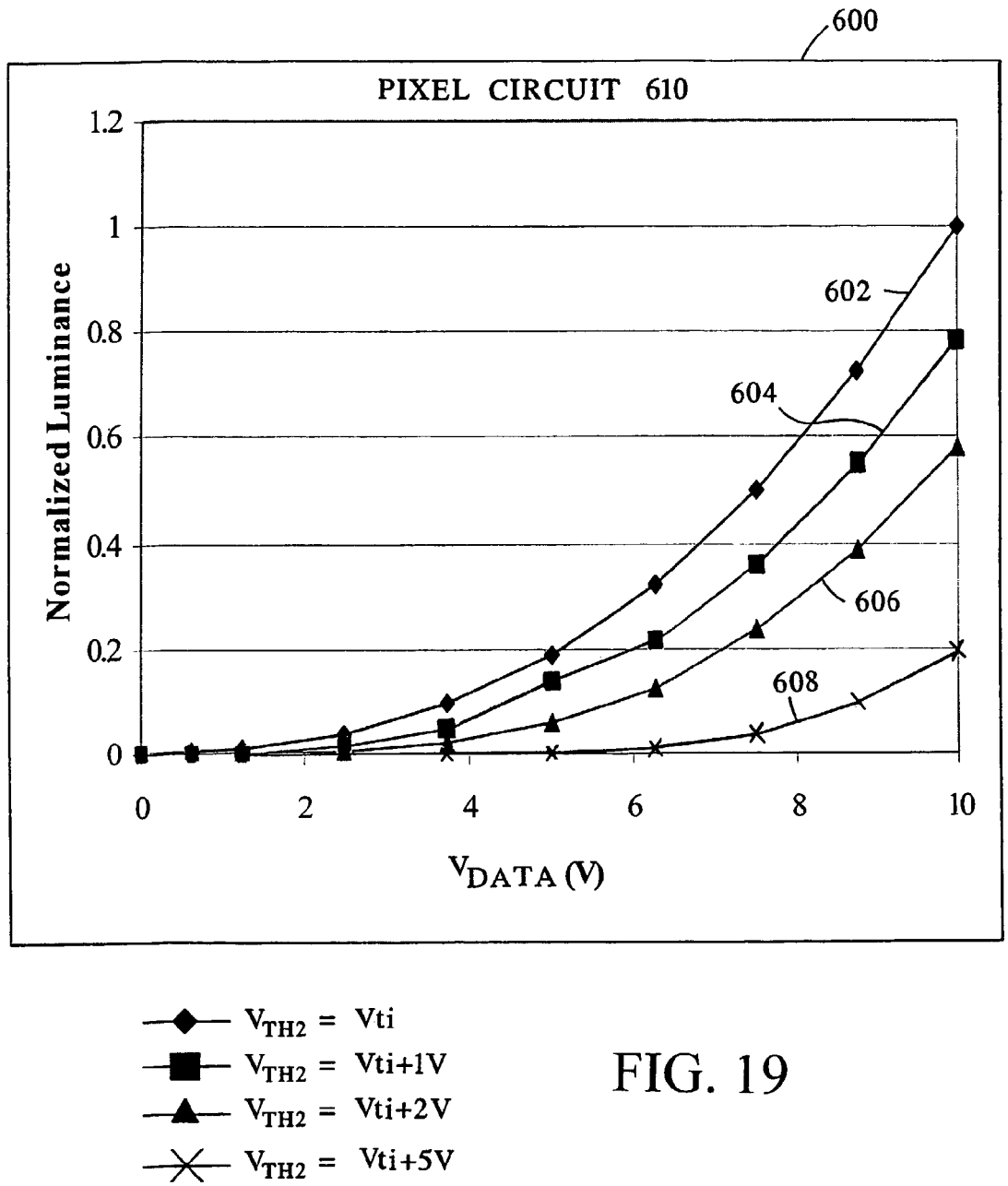
FIGS. 19 and 21-27 are graphs.
Figure 20:
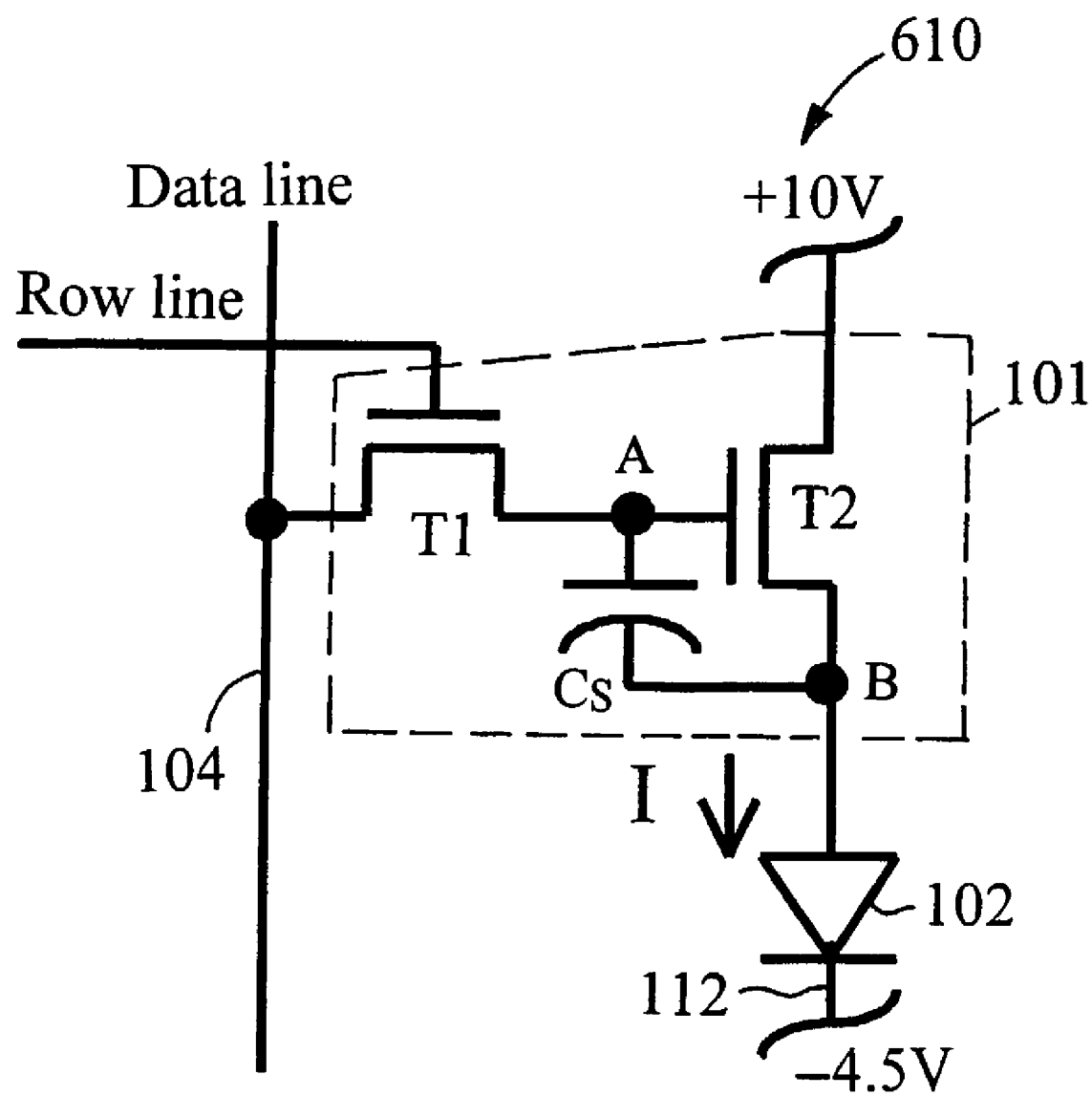

Referring to FIG. 19, a graph 600 shows normalized luminance as a function of data voltage ($V_{DATA}$) on data line 104 for a pixel circuit 610 (shown in FIG. 20). Pixel circuit 610 has the same configuration as pixel circuit 100 (FIG. 1), except that the drain of transistor T2 is connected to +10V, and $V_{CA}$ is maintained at a constant voltage −4.5V. Graph 600 was obtained by simulating the circuit for multiple frame periods, but using only the signal timings in the write data and expose subperiods in timing diagram 130 (FIG. 2). This represents using pixel circuit 100 by writing luminance data into the capacitor $C_S$ without threshold voltage correction.

Line 602 represents the normalized luminance as a function of data voltage ($V_{DATA}$) when the threshold voltage ($V_{TH2}$) of transistor T2 is at an initial value Vti. The data is normalized so that luminance=1 when $V_{DATA}$=10V. Lines 604, 606, and 608 show the decrease in luminance when the threshold voltage of transistor T2 increases by 1V, 2V, and 5V, respectively. The greater the shift in threshold voltage, the greater the degradation of luminance. For example, when $V_{DATA}$=10V, luminance drops 80% when the threshold voltage increases 5V.

Figure 21:
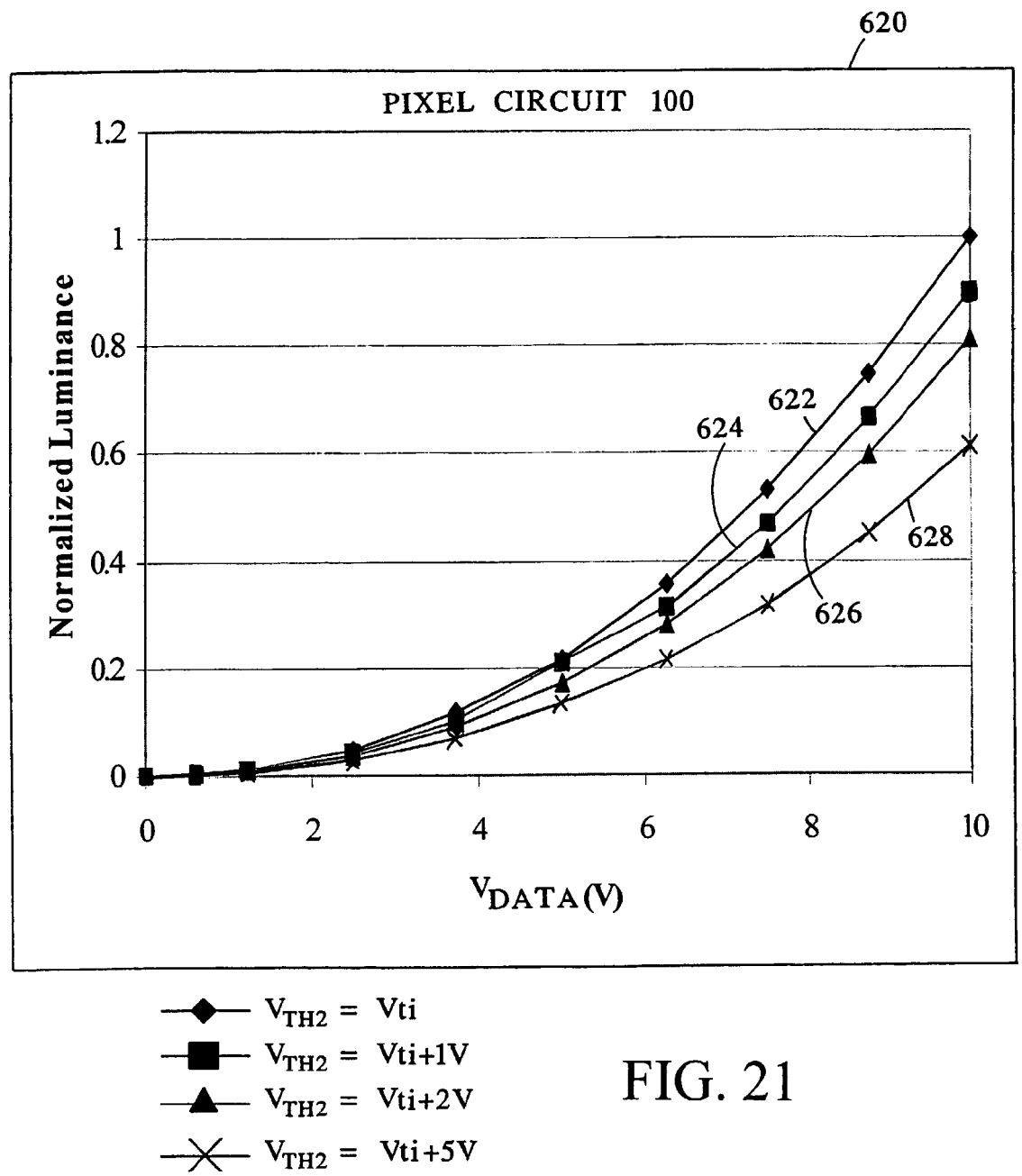

Referring to FIG. 21, a graph 620 shows normalized luminance of the pixel circuit 100 using the signal timing in timing diagram 130 (FIG. 2). For graph 620, threshold voltage correction was used. Line 622 represents the normalized luminance as a function of data voltage ($V_{DATA}$) when the threshold voltage ($V_{TH2}$) of transistor T2 is at the initial value Vti. The luminance data is normalized so that luminance=1 when $V_{DATA}$=10V Lines 624, 626, and 628 show the decreases in luminance as the threshold voltage of transistor T2 increases by 1V, 2V, and 5V, respectively.

Comparison of lines 624, 626, and 628 (FIG. 21) to lines 604, 606, and 608 (FIG. 19), respectively, shows that applying threshold voltage correction using the signal timing of timing diagram 130 reduces the change in luminance level caused by changes in the threshold voltage of transistor T2.

Figure 22:
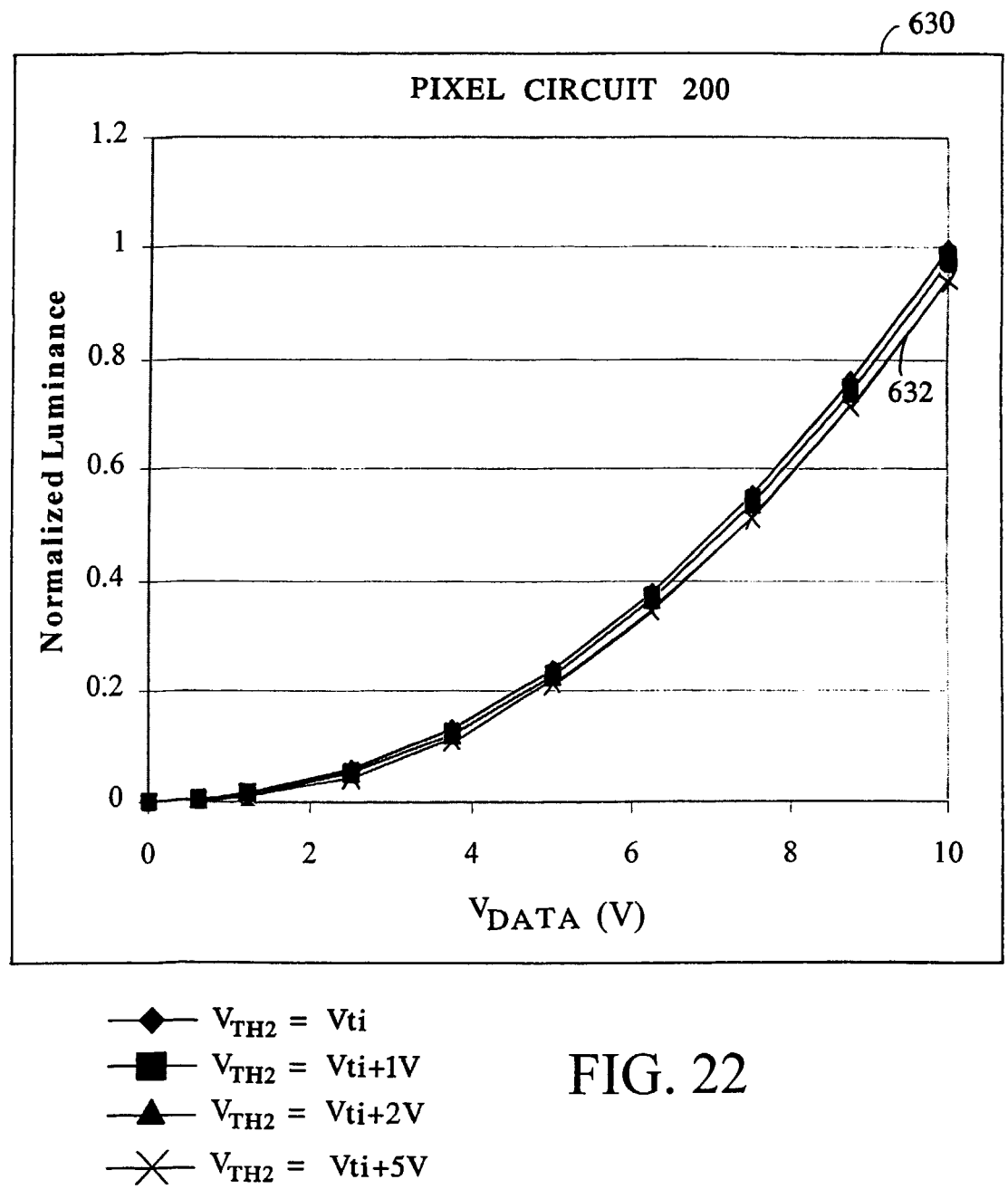

Referring to FIG. 22 a graph 630 shows the normalized luminance of the pixel circuit 200 in FIG. 3 that uses a data sampled switched current source 202. Threshold voltage correction is applied by using the signal timings in timing diagrams 130 (FIG. 2). The luminance varies little when the threshold voltage of transistor T2 increases 2V. Line 632 shows that even when the threshold voltage increases 5V, the luminance drops only about 6% for $V_{DATA}$=10V This is a significant improvement over the results shown in graph 620, where line 628 shows that the luminance drops almost 40% for $V_{DATA}$=10V when the threshold voltage of T2 increases 5V.

Figure 23:
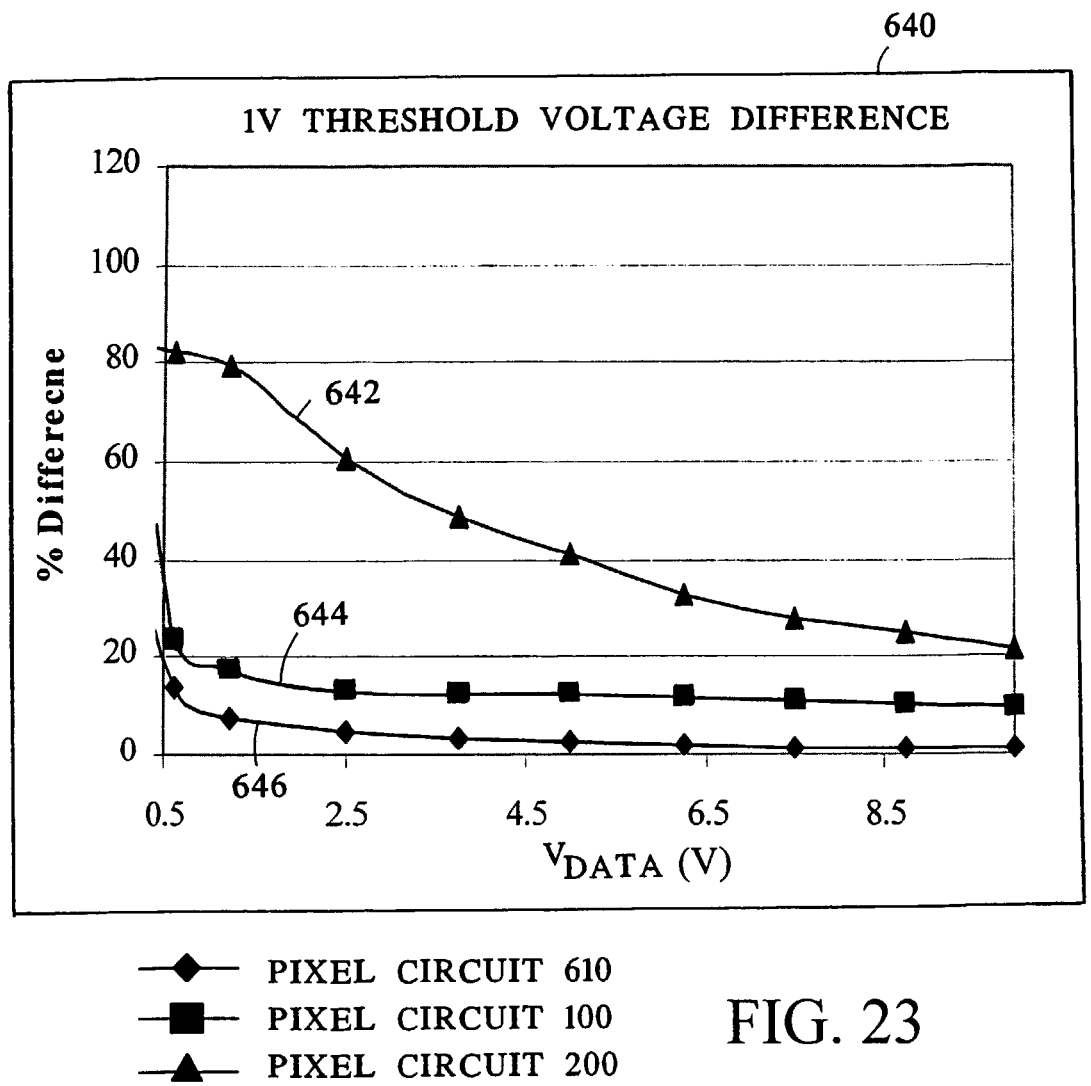

Referring to FIG. 23, a graph 640 shows a comparison of the luminance differences induced by a 1V threshold voltage variation for different pixel circuits and signal timings. Lines 642 and 644 show the luminance differences for pixel circuits 610 and 100, respectively, when the threshold voltage of transistor T2 varies by 1V. For line 642, threshold voltage correction was not used. For line 644, threshold voltage correction was used; i.e., the signal timings in timing diagrams 130 (including the write Vt subperiod 134) were used. Line 646 shows the luminance differences for pixel circuit 200 when the threshold voltage of transistor T2 varies by 1V. The signal timings in timing diagrams 130 was used.

Figure 24:
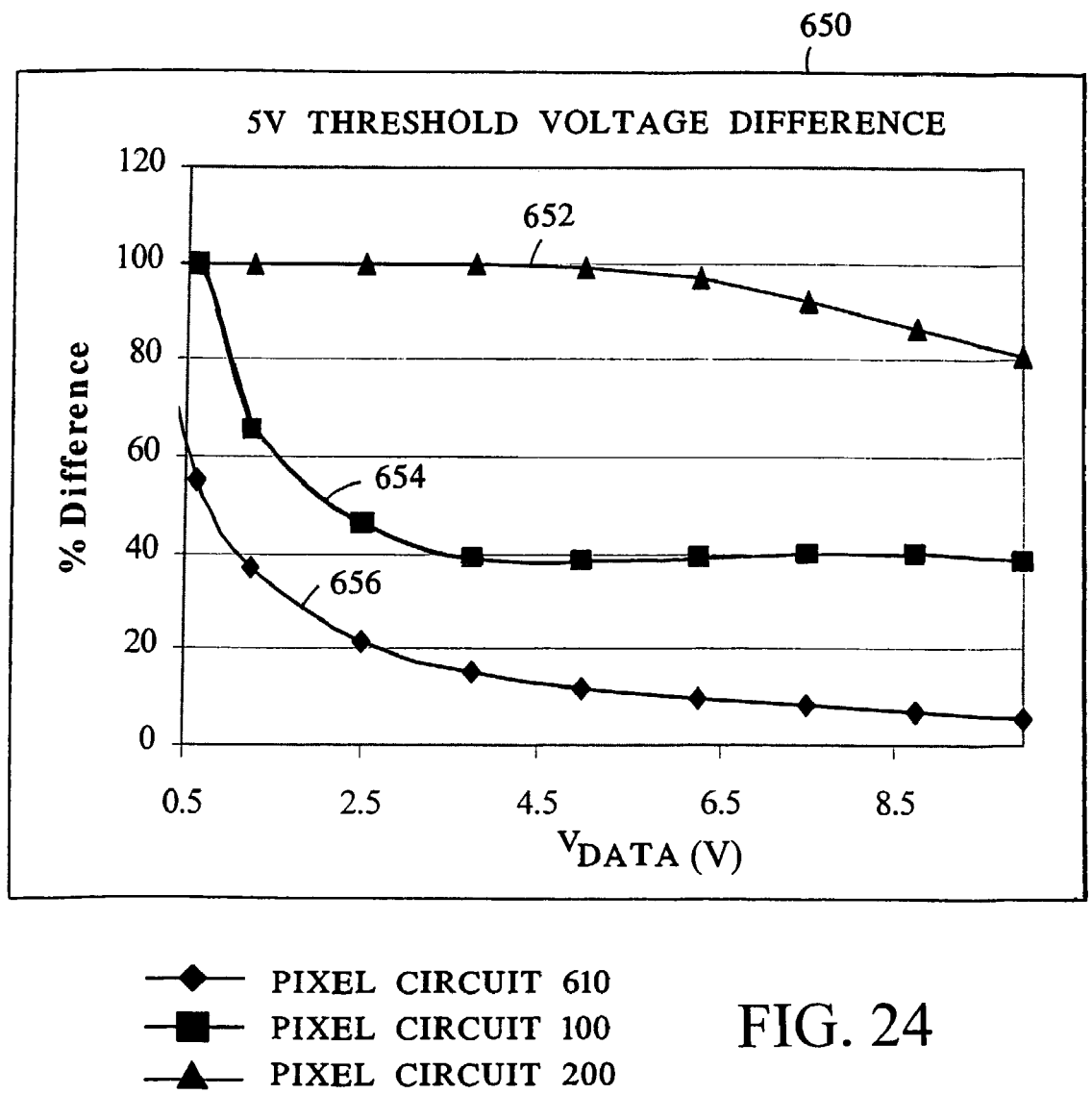

Referring to FIG. 24, a graph 650 compares the luminance differences induced by a 5V threshold voltage variation. Lines 652, 654, and 656 show data that were obtained under conditions similar to those for lines 642, 644, and 646, respectively, but with a 5V threshold voltage difference instead of a 1V difference.

Graphs 640 and 650 show that the luminance variations for pixel circuit 200 is less than pixel circuit 100 with threshold voltage correction, which in turn has less luminance variations than pixel circuit 100 without threshold voltage correction.

Figure 25:
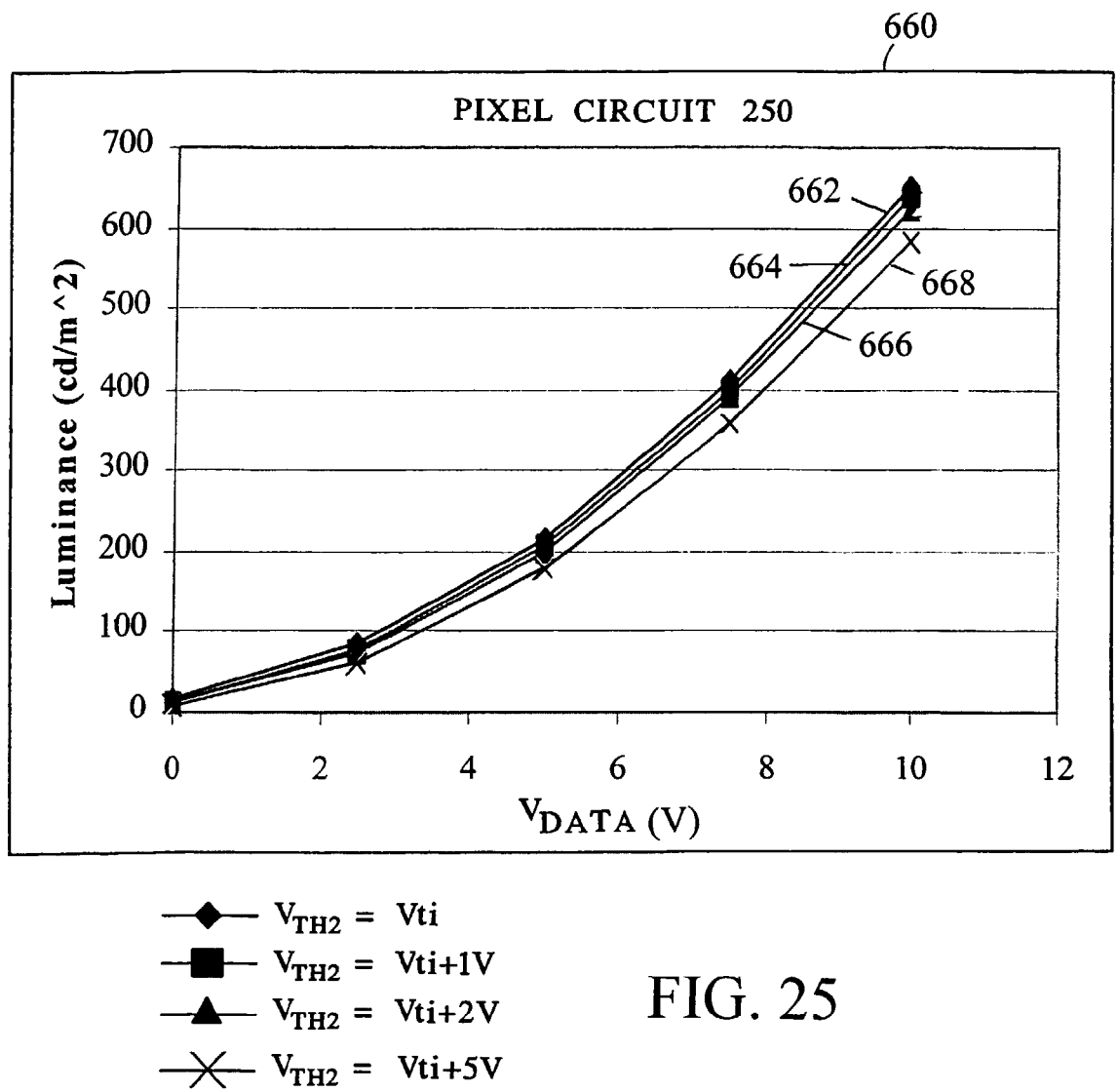

Referring to FIG. 25, a graph 660 shows luminance values as a function of data voltage for pixel circuit 250 (FIG. 5). The widths for transistors T1, T2, and T5 in pixel circuit 250 were 48, 64, and 48 microns, respectively. The capacitance of capacitor $C_S$ was 500 fF. Line 662 shows the luminance as a function of data voltage when the threshold voltage of transistor T2 is at an initial threshold voltage (Vti) of 2.5V. Lines 664, 666, and 668 show the relationships between the luminance level and the data voltage ($V_{DATA}$) when the threshold voltage of transistor T2 increase by 1V, 2V, and 5V, respectively. A comparison of line 668 with line 628 (FIG. 21) and line 632 (FIG. 22) shows that the luminance variations of pixel circuit 250 is less than those of pixel circuit 100, but greater than those of pixel circuit 200 for data voltages greater than 2V.

Figure 26:
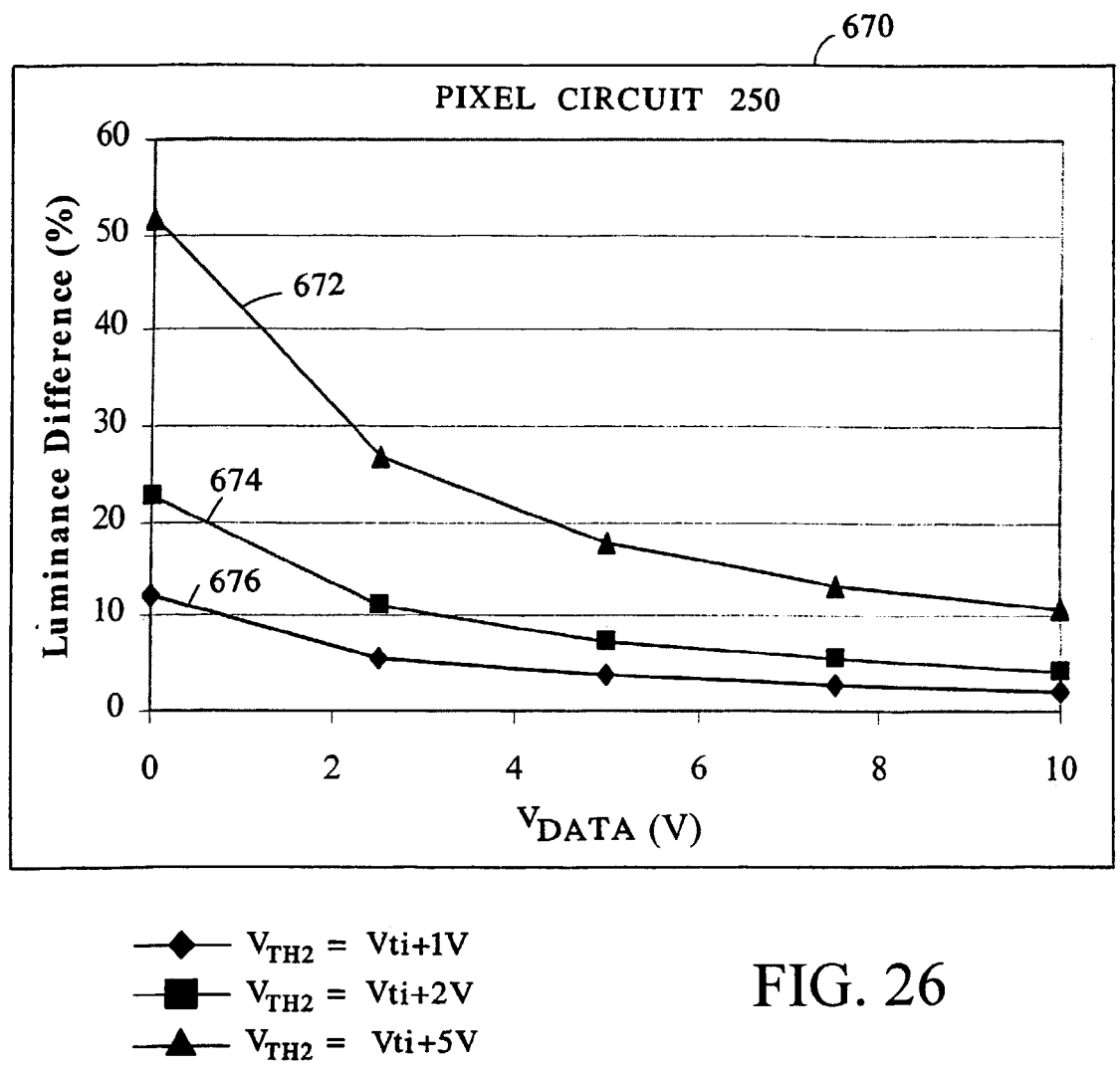

Referring to FIG. 26, a graph 670 shows luminance variations in relation to changes in the threshold voltage of the driving transistor T2 of pixel circuit 250 (FIG. 5). Lines 672, 674, and 676 show the luminance variations as a function of data voltage when the threshold voltage of transistor T2 increases 1V, 2V, and 5V, respectively, from the initial threshold voltage.

Figure 27:
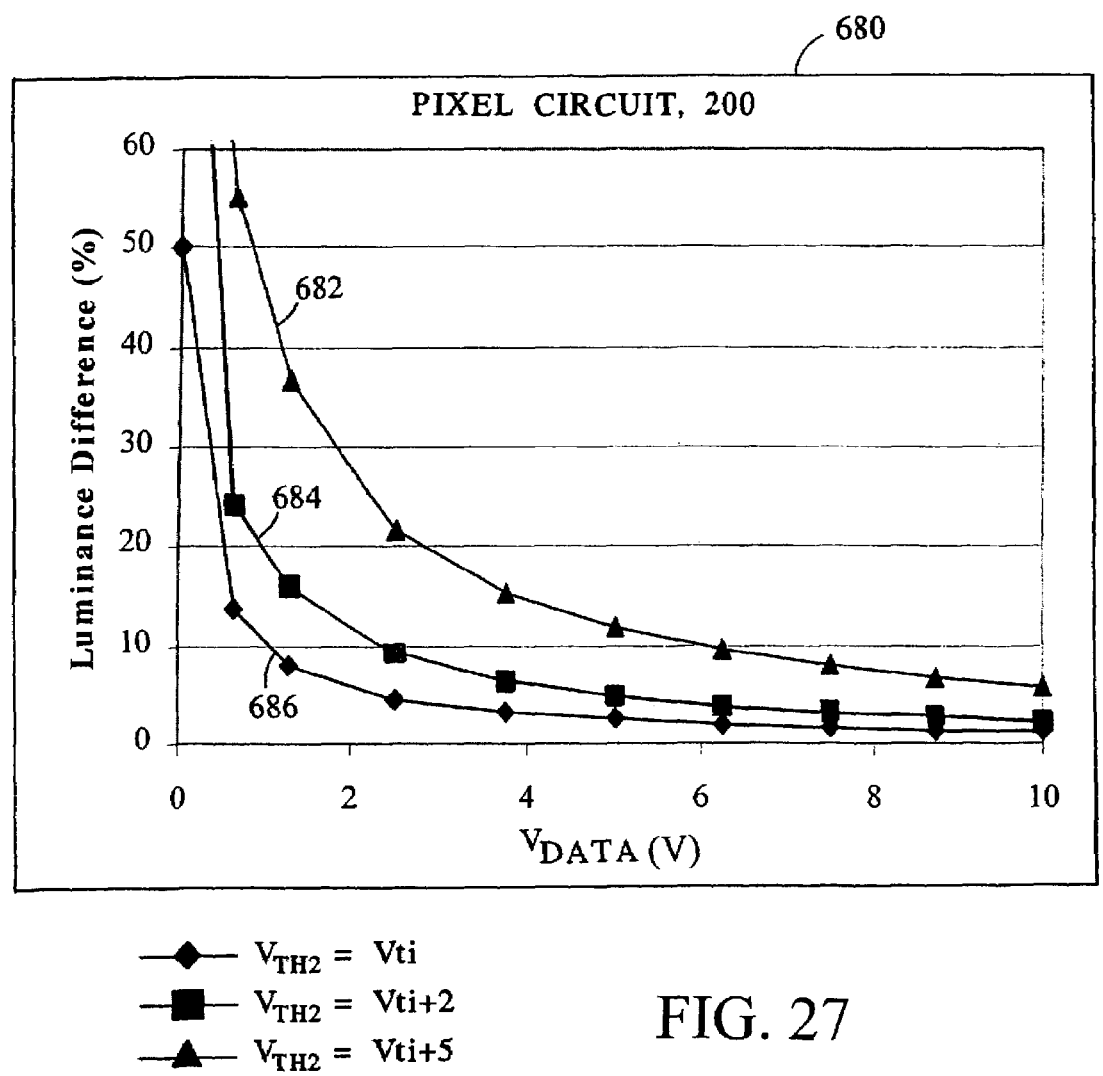

Referring to FIG. 27, a graph 680 shows luminance variations in relation to changes in the threshold voltage of the driving transistor T2 of pixel circuit 200 (FIG. 3). Lines 682, 684, and 686 show the luminance variations as a function of data voltage when the threshold voltage of transistor T2 increases 1V, 2V, and 5V, respectively, from the initial threshold voltage.

Comparing graphs 670 and 680, the luminance differences for pixel circuit 200 is greater than pixel circuit 250 when the data voltage is smaller (about less than 1V). The luminance differences for pixel circuit 200 is less than pixel circuit 250 when the data voltage is larger (about greater than 2V).

An advantage of using the pixel circuits described above is that because non-data control signals (e.g., the SW and $V_{CA}$ signals) can be common to all pixels in the display, standard commercial off the shelf LCD row and column drivers can be used. This reduces the cost of developing a new active matrix OLED display.

Referring to FIG. 28, an active matrix display 700 includes a pixel circuit array 702 that has rows and columns of pixel circuits, such as those shown in FIGS. 1, 3-7, 15, and 17. The OLEDs of pixel circuit array 702 form a viewing area 704 (enclosed in a thick line) of the active matrix display 700. Pixel circuits of array 702 are connected to row lines 706 and data lines 708. Row lines 706 are controlled by row drivers 710, and data lines 708 are controlled by data drivers 712. A display controller 720 generates and sends timing signals to the row drivers 710 through a bus 714. Display controller 720 generates and sends data signals and timing signals to data drivers 712 through a bus 726. Display controller 720 is designed to be fast enough to write data into the pixel circuits of array 702 in about half of a frame time (one frame~16.67 ms). Row drivers 710 and data drivers 712 can use commercially available LCD drivers.

Display controller 720 includes an auxiliary signal circuit 722 that generates SW and RS (not shown) control signals and a cathode voltage ($V_{CA}$) control signal. The $V_{CA}$ signal is connected to the cathode of the OLEDs in the pixel circuits of array 702. The SW control signal is used for the pixel circuits shown in FIGS. 3-5, 7, 15, and 17. The auxiliary signal circuit 722 generates the SW and $V_{CA}$ signals according to the timing diagrams shown in FIG. 2, 9, 16, or 18, depending on the type of pixel circuits used in pixel circuit array 702. Auxiliary signal circuit 722 has three DC voltage supply connections 724 that receive voltage signals V1, V2, and V3. The voltage signals V1, V2, and V3 supply the different voltage levels of the SW and $V_{CA}$ signals.

The SW and RS (not shown) signals can be distributed throughout the pixel circuit array 702 by using a column line (e.g., 718) for each column of pixel circuits. The SW signal distribution wiring may be incorporated on the active matrix backplane with a single external connection.

There can be two ways of distributing the $V_{CA}$ signal. In one example, the $V_{CA}$ signal is distributed to the pixel circuits of array 702 by using a row line (or column line) for each row (or column) of pixel circuits. In another example, the $V_{CA}$ signal can be distributed to all pixel circuits in array 702 by using a single sheet of indium tin oxide (ITO) covering the viewing area 704 of the OLED layer having external edge connections. The cathode of each OLED is thus connected to the ITO sheet, which is connected to display controller 720 through the external edge connections.

A ground reference voltage 730 is connected to the pixel circuits in array 702 by using a row line (e.g., 732) for each row of pixel circuits. The ground voltage distribution wiring can be incorporated on the active matrix backplane with one or more external connections.

In display 700, a pixel area 734 (enclosed in dashed lines) in the viewing area 704 includes an area surrounded by adjacent row lines (or ground lines) and adjacent data lines (or SW signal lines).

Although some examples have been discussed above, other implementation and applications are also within the scope of the following claims. For example, transistors T1-T8 were described as thin film transistors and fabricated using amorphous silicon or polysilicon. Other types of transistors, such as those made of organic semiconductors, can also be used for transistors T1-T8. The transistors T1-T3 and T4-T8 were described as NMOS transistors, while transistor T4 was described as a PMOS transistor. In other examples, the transistors T1-T3 and T4-T8 can be PMOS transistors, and transistor T4 can be an NMOS transistor. The control signals and the data signals may be adjusted accordingly.

A display including the pixel circuits discussed above may be used in many applications. Examples are computer displays, cell phone displays, head mount displays, televisions, hand held device displays, and electronic billboards. The display may have a single color or multiple colors. The pixel circuits do not necessarily have to be arranged in a matrix of columns and rows, but may be arranged in any manner depending on application. For example, even-number rows of pixels may be offset from odd-number rows of pixels. The pixel circuits may be fabricated on a rigid (e.g., glass) or flexible (e.g., plastic) substrate.

What is claimed is:

1. A method of driving a pixel circuit that includes a light emitting device, a storage device, a driving device for driving the light emitting device, and a switch, the method comprising:

during a first time period, charging the storage device to cause the storage device to store a voltage level representing a threshold voltage of the driving device by flowing a current through the driving device and the switch;

after the first time period and before a second time period, switching the switch for reducing a current which is to flow to or from the light emitting device in the second time period;

during the second time period, charging the storage device to cause the storage device to store a voltage level representing a sum of a threshold voltage of the driving device and a data voltage representing a level of illumination of the light emitting device; and after the second time period, switching the switch to permit the driving device to drive the light emitting device based on the voltage level stored in the storage device.

2. The method of claim 1 in which the light emitting device has a first terminal configured to receive a current from the driving device and a second terminal coupled to a control voltage, the method comprising:

during the first time period,
setting a terminal of the storage device to a first voltage level;
setting the control voltage to a second voltage level that is more negative than the first voltage level; and
setting the control voltage to a third voltage level that is more positive than the second voltage level.

3. The method of claim 1, further comprising compensating variations in the voltage level stored in the storage device due to a voltage coupling from switching of a control voltage coupled to a terminal of the light emitting device.

4. The method of claim 1, in which the light emitting device comprises a light emitting diode, and the method comprises, during the first time period, supplying a reference voltage to a first terminal of the storage device;
supplying a first control voltage to a cathode of the light emitting diode such that a voltage across the storage device becomes larger than a threshold voltage of the driving device;
supplying a second control voltage to the cathode such that a voltage across the light emitting diode in the forward direction becomes less than an onset voltage of the light emitting diode;
charging or discharging the capacitor using the transistor after the acts of supplying the first and the second control voltage to the cathode such that a voltage substantially the same as the threshold voltage of the transistor develops across the capacitor.

5. The method of claim 4, further comprising
supplying the reference voltage to a signal line and connecting the signal line to the first terminal of the storage device through a second switching device during the first time period, and
supplying a data voltage to the signal line and connecting the signal line to the first terminal of the storage device through the second switching device during the second time period, the data voltage representing the level of illumination.

6. The method of claim 2, wherein the second voltage level has a value such that a voltage difference develops across the storage device, the voltage difference being sufficient to turn on the driving device during the lifetime of the pixel circuit.

7. The method of claim 2, wherein the third voltage level has a value so as to allow a current to conduct in the driving device but not allow the light emitting device to be turned on to emit light.

8. The method of claim 2, further comprising supplying the data voltage to the storage device using a data line, the data line having a first ground voltage level that is different from a second ground voltage level of the driving device.

9. The method of claim 2, further comprising supplying the first voltage level through a second switching device to the terminal of the storage device during the first time period, and supplying the data voltage through the second switching device to the terminal of the storage device during the second time period.

10. The method of claim 2 wherein the driving device comprises a transistor having a first control gate and a second control gate.

11. The method of claim 2 wherein the light emitting device comprises a light emitting diode, and the first terminal of the light emitting device comprises an anode of the light emitting diode.

12. The method of claim 2, further comprising, during a certain time period, causing a voltage difference across the storage device to converge towards a level substantially the same as the threshold voltage of the driving device.

13. The method of claim 12 wherein causing the voltage difference across the storage device to converge towards a level substantially the same as the threshold voltage of the driving device comprises causing the voltage difference across the storage device to asymptotically converge towards a level substantially the same as the threshold voltage of the driving device.

14. The method of claim 1, wherein reducing the current flowing to or from the light emitting device comprises turning off the switch.

15. The method of claim 4 wherein the second control voltage has a value so as to allow a current to conduct in the transistor.

16. The method of claim 5 wherein the signal line has a first ground voltage level that is different from a second ground voltage level of the driving device.

17. The method of claim 4, further comprising supplying the first voltage level through a second switching device to the terminal of the storage device during the first time period, and supplying the data voltage through the second switching device to the terminal of the storage device during the second time period.

18. The method of claim 1, wherein reduce driving of the light emitting device comprises turning off the driving of the light emitting device.

19. The method of claim 1 wherein reducing the driving of the light emitting device comprises isolating an input of the driving device from the storage device.

20. The method of claim 1 wherein the switch comprises a transistor.

21. The method of claim 1 wherein the driving device comprises a transistor.

22. The method of claim 21 wherein the transistor comprises at least two control gates.

23. The method of claim 22 wherein the transistor comprises a depletion gate and an accumulation gate.

24. The method of claim 1, further comprising, during the first time period, switching a control voltage level of a terminal of the light emitting device.

* * * * *